United States Patent
Miyakawa et al.

(10) Patent No.: US 6,707,736 B2
(45) Date of Patent: Mar. 16, 2004

(54) SEMICONDUCTOR MEMORY DEVICE

(75) Inventors: Tadashi Miyakawa, Yokohama (JP); Daisaburo Takashima, Yokohama (JP); Thomas Roehr, Yokohama (JP)

(73) Assignees: Kabushiki Kaisha Toshiba, Tokyo (JP); Infineon Technologies, AG, Munich (DE)

( * ) Notice: Subject to any disclaimer, the term of this patent is extended or adjusted under 35 U.S.C. 154(b) by 0 days.

(21) Appl. No.: 10/165,277

(22) Filed: Jun. 10, 2002

(65) Prior Publication Data

US 2003/0227806 A1 Dec. 11, 2003

(51) Int. Cl.$^7$ .................................................. G11C 7/00
(52) U.S. Cl. .................... 365/201; 365/189.03; 365/233
(58) Field of Search ............................. 365/201, 189.03, 365/189.05, 189.01, 191, 230.05, 233

(56) References Cited

U.S. PATENT DOCUMENTS

| | | | |
|---|---|---|---|
| 5,151,881 A | 9/1992 | Kajigaya et al. ............. 365/233 |
| 5,317,711 A | 5/1994 | Bourekas et al. ............ 395/425 |
| 5,400,281 A * | 3/1995 | Morigami ..................... 365/201 |
| 5,936,900 A * | 8/1999 | Hii et al. ..................... 365/201 |
| 6,003,107 A | 12/1999 | Ranson et al. ............... 710/131 |
| 6,252,820 B1 | 6/2001 | Nakamura .................... 365/233 |
| 6,392,948 B1 | 5/2002 | Lee ............................. 365/222 |

FOREIGN PATENT DOCUMENTS

| JP | 11-185500 | 7/1999 |
|---|---|---|
| JP | 2001-52498 | 2/2001 |

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor memory device includes a memory cell array, a plurality of input/output terminals to input cell data written to the memory cell array and output cell data read from the memory cell array, a test mode setting circuit which sets a test mode to monitor a plurality of timing signals which control input/output operation timing of the cell data, and switch circuits connected to the plurality of input/output terminals. The switch circuits simultaneously output the plurality of timing signals from the plurality of input/output terminals in the test mode.

18 Claims, 22 Drawing Sheets

SEMICONDUCTOR MEMORY DEVICE

BACKGROUND OF THE INVENTION

1. Field of the Invention

The present invention relates to a semiconductor memory device. More specifically, the invention relates to a semiconductor memory chip capable of easily analyzing an internal operation thereof.

2. Description of the Related Art

Conventionally, a probing method and a method using an electron beam have been used to analyze an internal operation of a semiconductor chip.

The probing method is to directly read timing of internal signals and variations in voltage by applying a probe to a node in a semiconductor chip. In this method, the probe needs to be directly applied to the node. Therefore, a sample chip for evaluating an internal operation of the chip has to be formed through a process such as a removal of an oxide film from above a wiring layer. This method requires a lot of time to evaluate the internal operation. Since, moreover, the probe is brought into direct contact with the node in the chip, the sample chip is easily destroyed at the time of the evaluation. In this case, a sample chip is often formed from the beginning; thus, it is difficult to evaluate the internal operation of the chip with efficiency.

The method using an electron beam is to evaluate timing of internal signals and variations in voltage by emitting an electron beam to a node in a semiconductor chip and two-dimensionally reading variations in the potential of the node. This method necessitates a very expensive, large-sized apparatus and a sample chip for the evaluations. This method therefore requires a lot of time to make the evaluations and increase the costs therefor. As in the above probing method, it is difficult to make the evaluations with efficiency.

Since the above conventional methods require a sample chip and a lot of time, efficient evaluations cannot be performed for a target chip. The methods also require a special-purpose apparatus and thus efficient evaluations are difficult to make in terms of costs. Moreover, the conventional methods are not suitable for acquiring a large amount of data in order to make evaluations in view of variations in lots and wafers.

As a method of resolving the above problems, a semiconductor memory device that is easy to verify and evaluate its characteristics has recently been proposed (disclosed in, for example, Jpn. Pat. Appln. KOKAI Publication No. 2001-52498 corresponding to U.S. Pat. No. 6,252,820). According to the proposed semiconductor memory device, an SRAM (static random access memory) for reading/ writing data to/from a memory cell array by generating an internal control signal from a control signal generation circuit in response to a clock signal includes a monitor control signal input terminal, an output buffer for monitoring, and a monitor output terminal. Such a configuration allows the timing and pulse widths of internal control signals that are generated in response to clock signals to be monitored.

In the semiconductor memory device, however, some of the internal control signals are output from the special-purpose monitor output terminal. The monitor output terminal is covered with an envelope when the SRAM is packaged. Thus, the characteristics of the device cannot be verified or evaluated after the packaging of the SRAM.

As described above, the prior art semiconductor memory device can monitor the timing and pulse widths of internal control signals. However, the device has a problem that its characteristics cannot be verified or evaluated after packaging.

BRIEF SUMMARY OF THE INVENTION

A semiconductor memory device according to an embodiment of the present invention comprises a memory cell array, a plurality of input/output terminals to input cell data written to the memory cell array and output cell data read from the memory cell array, a test mode setting circuit which sets a test mode to monitor a plurality of timing signals which control input/output operation timing of the cell data, and switch circuits which simultaneously output the plurality of timing signals from the plurality of input/output terminals in the test mode.

DETAILED DESCRIPTION OF THE INVENTION

Embodiments of the present invention will now be described with reference to the accompanying drawings.

First Embodiment

Figure 1:
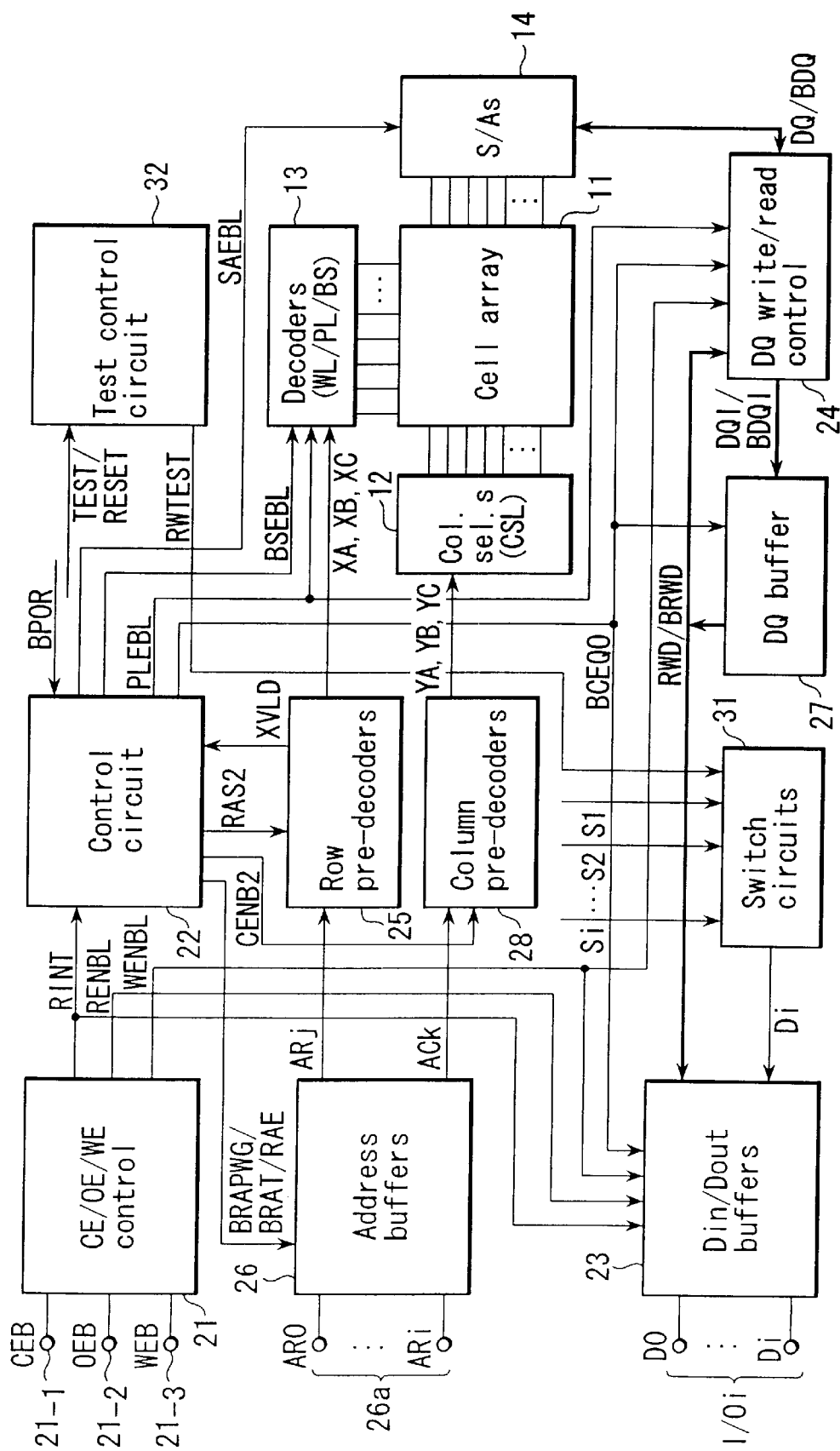
FIG. 1 is a block diagram showing an example of a configuration of a semiconductor memory device (semiconductor memory chip) according to a first embodiment of the present invention.

FIG. 1 shows an example of a configuration of a semiconductor memory device (semiconductor memory chip) according to a first embodiment of the present invention. In the first embodiment, switch circuits and a test control circuit serving as a test mode setting circuit are added to the existing semiconductor memory chip to allow a plurality of timing control signals, which controls the operation timing in the chip, to be monitored at the same time.

In FIG. 1, a memory cell array 11 includes a plurality of memory cells (not shown) that are arranged in matrix to read/write cell data. The memory cell array 11 also includes a plurality of word lines and a plurality of bit lines that intersect each other at right angles. The memory cells are located at their respective intersections of the word and bit lines.

Column select circuits 12 and decoder circuits 13 are arranged adjacent to the memory cell array 11. Sense amplifier circuits 14 are arranged close to the memory cell array 11.

External input terminals $21_{-1}$, $21_{-2}$ and $21_{-3}$ are connected to an internal control signal generation circuit 21. An operation control circuit 22, data input/output buffer circuits 23, and a data write/read control circuit 24 are also connected to the circuit 21.

The internal control signal generation circuit 21 is supplied with external control signals from the external input terminals $21_{-1}$, $21_{-2}$ and $21_{-3}$. Of the external control signals, a chip enable signal CEB is supplied from the terminal $21_{-1}$, an output enable signal OEB is supplied from the terminal $21_{-2}$, and a write enable signal WEB is supplied from the terminal $21_{-3}$. The circuit 21 generates an internal control signal RINT based on the external control signals and sends it to both the operation control circuit 22 and the data input/output buffer circuits 23. The circuit 21 also generates an internal control signal (read operation control signal) RENBL and sends it to the data input/output buffer circuits 23. The circuit 21 also generates an internal control signal (write operation control signal) WENBL and sends it to both the data input/output buffer circuits 23 and the data write/read control circuit 24.

Figure 2:
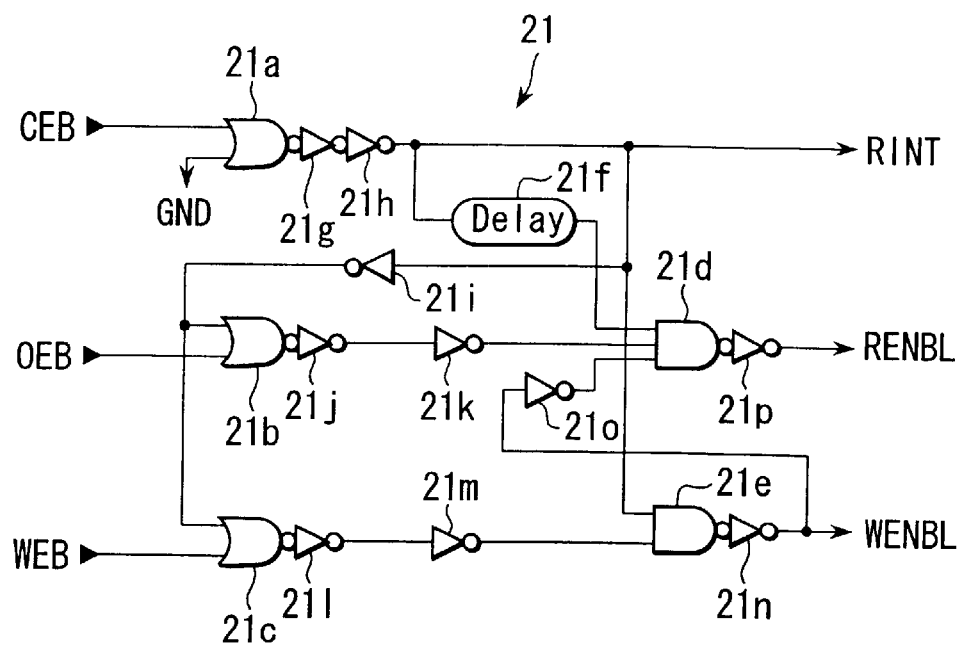
FIG. 2 is a circuit diagram showing an example of arrangement of an internal control signal generation circuit in the semiconductor memory chip shown in FIG. 1.

The internal control signal generation circuit 21 includes three NOR circuits 21a, 21b and 21c, two NAND circuits 21d and 21e, one delay circuit 21f, and ten inverter (NOT) circuits 21g, 21h, . . . , and 21p, as illustrated in FIG. 2. The chip enable signal CEB is supplied to one input terminal of the NOR circuit 21a. The other input terminal of the NOR circuit 21a is grounded (GND). An output of the NOR circuit 21a is produced as a signal RINT through the inverter circuits 21g and 21h. An output (signal RINT) of the inverter circuit 21h is supplied to a first input terminal of the NAND circuit 21d via the delay circuit 21f. The output (signal RINT) of the inverter circuit 21h is also supplied to one input terminal of the NAND circuit 21e and supplied to one input terminal of each of the NOR circuits 21b and 21c via the inverter circuit 21i. The signal OEB is supplied to the other input terminal of the NOR circuit 21b. An output of the NOR circuit 21b is supplied to a second input terminal of the NAND circuit 21d through the inverter circuits 21j and 21k. The signal WEB is supplied to the other input terminal of the NOR circuit 21c. An output of the NOR circuit 21c is supplied to the other input terminal of the NAND circuit 21e via the inverter circuits 21l and 21m. An output of the NAND circuit 21e is produced as a signal WENBL through the inverter circuit 21n and supplied to a third input terminal of the NAND circuit 21d through the inverter circuit 21o. An output of the NAND circuit 21d is produced as a signal RENBL through the inverter circuit 21p.

In a standby state, the level of signal CEB input to the internal control signal generation circuit 21 is high (H). In contrast, the levels of signals RINT, RENBL and WENBL output from the circuit 21 are all low (L), irrespective of the levels of input signals OEB and WEB. In an active state, e.g., a normal cell data read mode, the levels of signals CEB and OEB input to the circuit 21 is low and the level of signal WEB input thereto is high. In contrast, the levels of signals RINT and RENBL output from the circuit 21 are high and the level of signal WENBL output therefrom is low. In a normal cell data write mode, the levels of signals CEB and WEB input to the circuit 21 is low and the level of signal OEB input thereto is high. In contrast, the levels of signals RINT and WENBL output from the circuit 21 are high and the level of signal RENBL output therefrom is low.

According to the first embodiment, if the signal CEB input to the circuit 21 is set at a low level and the signals OEB and WEB input thereto are set at a high level in a test mode other than the normal read and write modes, a read monitor test mode can be executed. In other words, the device is set in the test mode and then goes into an active state (the level of signal CEB is low) and a disable state (the levels of signals OEB and WEB are high) in which cell data is inhibited from being read or written. It is thus possible to start a read monitor test mode in which a plurality of timing control signals can simultaneously be monitored in an internal circuit in the normal read state.

The decoder circuits 13, sense amplifier circuits 14, internal control signal generation circuit 21, data write/read control circuit 24, row predecoder circuits 25, address buffer circuits 26, data buffer circuits 27, and column predecoder circuits 28 are connected to the operation control circuit 22.

Figure 3:
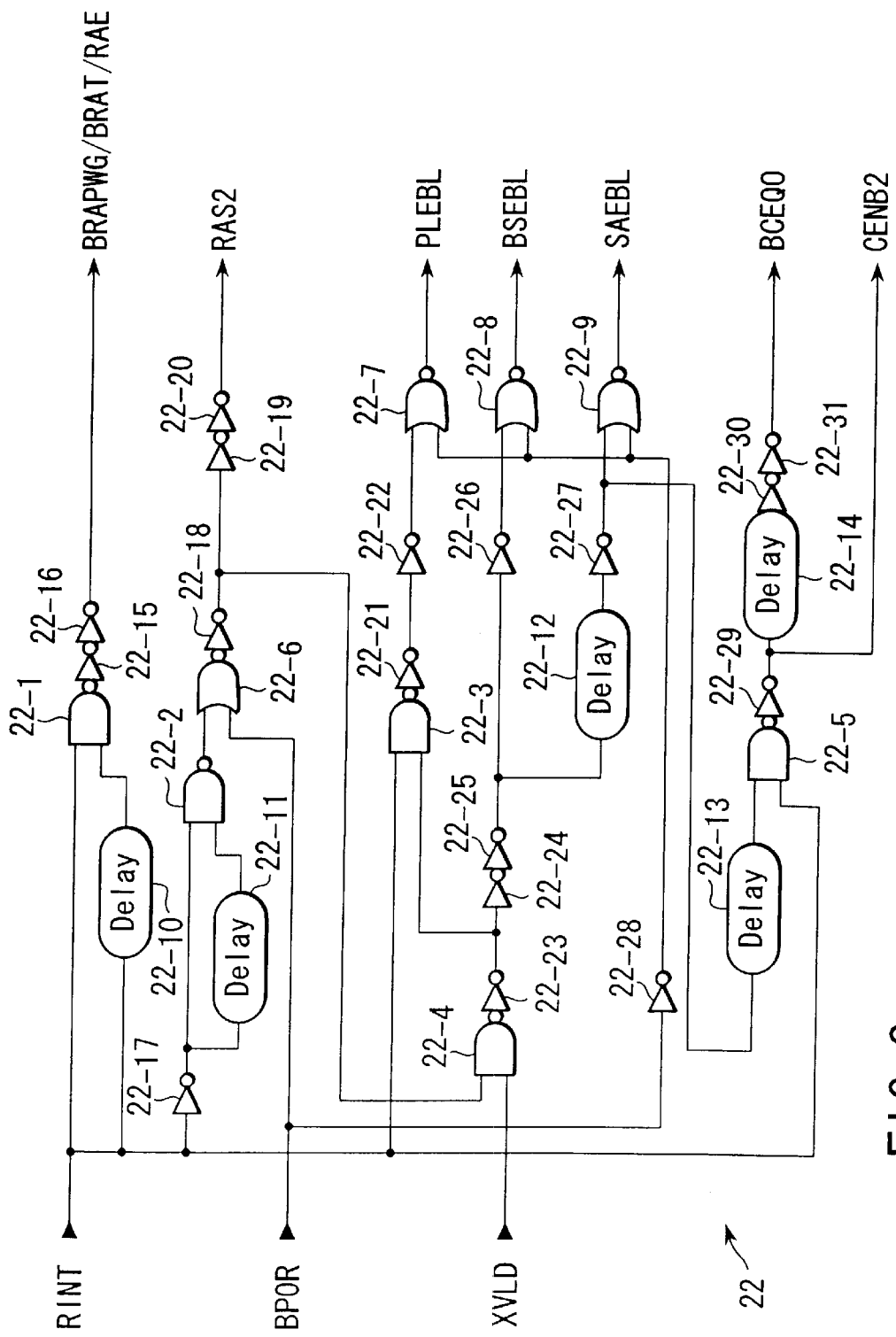
FIG. 3 is a circuit diagram showing an example of arrangement of an operation control circuit in the semiconductor memory chip shown in FIG. 1.

As shown in FIG. 3, the operation control circuit 22 includes five NAND circuits $22_{-1}$, $22_{-2}$, $22_{-3}$, $22_{-4}$ and $22_{-4}$, four NOR circuits $22_{-6}$, $22_{-7}$, $22_{-8}$, and $22_{-9}$, five delay circuits $22_{-10}$, $22_{-11}$, $22_{-12}$, $22_{-13}$ and $22_{-14}$, and seventeen inverter circuits $22_{-15}$, $22_{-16}$, . . . , and $22_{-31}$.

The operation control circuit 22 is supplied with signals RINT, XVLD and BPOR. For example, the signal RINT is supplied from the internal control signal generation circuit 21 and the signal XVLD is supplied from the row predecoder circuits 25. In response to these signals, the operation control circuit 22 generates signals BRAPWG, BRAT and RAE and transmits them to the address buffer circuits 26. The circuit 22 generates a signal RAS2 and supplies it to the row predecoder circuits 25. The circuit 22 generates a plate line enable signal PLEBL and sends it to both the decoder circuits 13 and the data write/read control circuit 24. The circuit 22 generates a block select line enable signal BSEBL and transmits it to the decoder circuits 13. The circuit 22 generates a sense amplification enable signal SAEBL and outputs it to the sense amplifier circuits 14. The circuit 22 generates a signal BCEQO and supplies it to the data input/output buffer circuits 23, data write/read control circuit 24, and data buffer circuit 27. The circuit 22 generates a signal CENB2 and outputs it to the column predecoder circuits 28.

A plurality of address input terminals 26a (a=0 to i) are connected to the address buffer circuits 26. The operation control circuit 22, row predecoder circuits 25, and column predecoder circuits 28 are connected to the address buffer circuits 26.

The address buffer circuits 26 are supplied with external address signals ARi (i=0 to i) from the address input terminals 26a and signals BRAPWG, BRAT and RAE from the operation control circuit 22. In response to these signals, the address buffer circuits 26 generate a signal ARj and supply it to the row predecoder circuits 25. The circuits 26 also generate a column address signal ACk and supply it to the column predecoder circuits 28.

The decoder circuits 13, operation control circuit 22, and address buffer circuits 26 are connected to the row predecoder circuits 25.

The signal RAS2 is supplied to the row predecoder circuits 25 from the operation control circuit 22 and the signal ARj is supplied to the circuits 25 from the address buffer circuits 26. In response to these signals, the row predecoder circuits 25 generate a signal XVLD and supply it to the operation control circuit 22. The circuits 25 also generate row address signals XA, XB and XC and send them to the decoder circuits 13.

The memory cell array 11, operation control circuit 22, and row predecoder circuits 25 are connected to the decoder circuits 13.

The signals PLEBL and BSEBL are supplied to the decoder circuits 13 from the operation control circuit 22 and the signals XA, XB and XC are supplied to the circuits 13 from the row predecoder circuits 25. In response to these signals, the circuits 13 generate an operating voltage according to an operating mode.

Figure 4:
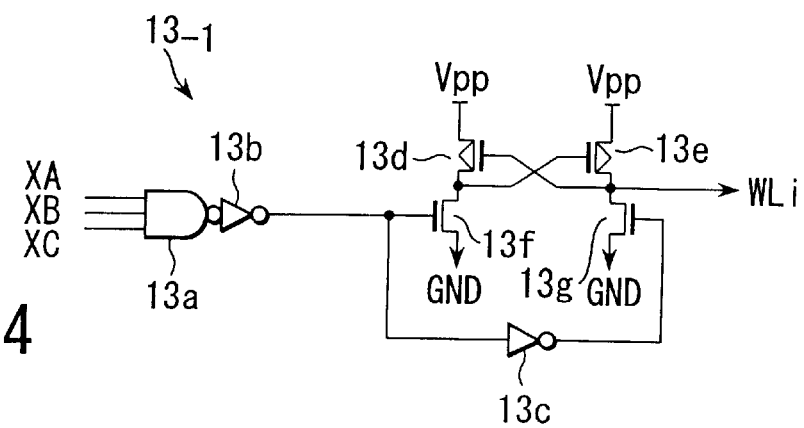
FIG. 4 is a circuit diagram showing an example of arrangement of decoder circuits in the semiconductor memory chip shown in FIG. 1.

The decoder circuits 13 include a plurality of row decoders $13_{-1}$. FIG. 4 shows an example of one of the row decoders $13_{-1}$. The number of row decoders $13_{-1}$ corresponds to that of word lines WLi (e.g., i=0 to 1023). Each of the row decoders $13_{-1}$ includes one NAND circuit 13a, two inverter circuits 13b and 13c, two p-channel MOS transistors 13d and 13e, and two n-channel MOS transistors 13f and 13g. The row decoders $13_{-1}$ generate word line voltages (operating voltages) in response to the signals XA, XB and XC to selectively drive the word lines WLi in the memory cell array 11.

The decoder circuits 13 also include a circuit (not shown) for selectively driving the plate lines (PL) in the memory cell array 11 in response to the signal PLEBL and a circuit (not shown) for selectively driving the block select lines (BS) in the memory cell array 11 in response to the signal BSEBL.

The column select circuits 12, operation control circuit 22 and address buffer circuits 26 are connected to the column predecoder circuits 28.

The signal CENB2 is supplied to the column predecoder circuits 28 from the operation control circuit 22 and the signal ACk is supplied to the circuits 28 from the address buffer circuits 26. In response to these signals, the circuits 28 generate column address signals YA, YB and YC and supply them to the column select circuits 12.

The memory cell array 11 and column predecoder circuits 28 are connected to the column select circuits 12.

The column select circuits 12 generate column select signals in response to the signals YA, YB and YC from the column predecoder circuits 28 to selectively drive the column select lines CSLi in the memory cell array 11.

Figure 5:
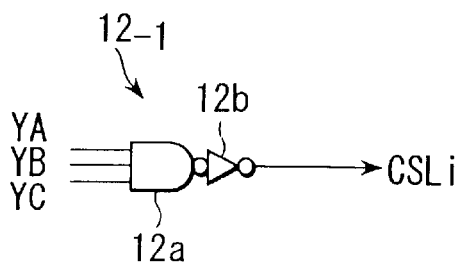
FIG. 5 is a circuit diagram showing an example of arrangement of column select circuits in the semiconductor memory chip shown in FIG. 1.

The column select circuits 12 include a plurality of column selectors $12_{-1}$ as illustrated in FIG. 5. The number of column selectors $12_{-1}$ corresponds to that of column select lines CSLi (e.g., i=0 to 511). Each of the column selectors $12_{-1}$ includes one NAND circuit 12a and one inverter circuit 12b.

The memory cell array 11, operation control circuit 22, and data write/read control circuit 24 are connected to the sense amplifier circuits 14.

The signal SAEBL is supplied to the sense amplifier circuits 14 from the operation control circuit 22. Thus, the circuits 14 amplify the potential of each of the bit lines (BL) in the memory cell array 11. The sense amplifier circuits 14 sense cell data supplied to the bit lines BL from the memory cell array 11 in, for example, the normal read mode. Then, the circuits 14 convert the cell data into data DQ and BDQ and send them to the data write/read control circuit 24. In the normal write mode, the sense amplifier circuits 14 receive the data DQ and BDQ from the circuit 24 and output them to the memory cell array 11.

The sense amplifier circuits 14, internal control signal generation circuit 21, operation control circuit 22, data input/output buffer circuits 23, and data buffer circuit 27 are connected to the data write/read control circuit 24.

The signal WENBL is supplied to the data write/read control circuit 24 from the internal control signal generation circuit 21. The signals PLEBL and BCEQO are supplied to the circuit 24 from the operation control circuit 22. Data DQ and BDQ are transferred between the circuit 24 and the sense amplifier circuit 14. Data RWD and BRWD are transferred between the circuit 24 and the data input/output buffer circuits 23. Further, the circuit 24 supplies data DQI and BDQI to the data buffer circuit 27.

The data write/read control circuit 24 receives data RWD and BRWD from the data input/output buffer circuits 23 in, for example, the normal write mode. Then, the circuit 24 converts the data RWD and BRWD into data DQ and BDQ and supplies them to the sense amplifier circuits 14. In, for example, the normal read mode, the circuit 24 receives data DQ and BDQ from the sense amplifier circuits 14. The circuit 24 converts data DQ and BDQ into data DQI and BDQI and stores them in the data buffer circuit 27.

The operation control circuit 22, data input/output buffer circuits 23, and data write/read control circuit 24 are connected to the data buffer circuit 27.

The signal BCEQO is supplied to the data buffer circuit 27 from the operation control circuit 22. The data buffer circuit 27 receives data DQI and BDQI from the data write/read control circuit 24 in, for example, the normal read mode. Then, the circuit 27 converts the data DQI and BDQI into data RWD and BRWD and supplies them to the data input/output buffer circuits 23.

A plurality of data input/output terminals I/Oi (e.g., i=0 to 15) are connected to the data input/output buffer circuits 23. The internal control signal generation circuit 21, operation control circuit 22, data write/read control circuit 24, and data buffer circuit 27 are connected to the data input/output buffer circuits 23.

The data input/output buffer circuits 23 are supplied with data Di (i=0 to 15) as cell data from the data input/output terminals I/Oi. The circuits 23 are also supplied with signals RINT, RENBL and WENBL from the internal control signal generation circuit 21. Further, the circuits 23 are supplied with signal BCEQO from the operation control circuit 22. The circuits 23 convert the data Di into data RWD and BRWD and send them to the data write/read control circuit 24 (in the normal write mode). The circuits 23 also convert the data RWD and BRWD into data Di and output it from the data input/output terminals I/Oi (in the normal read mode).

Figure 6:
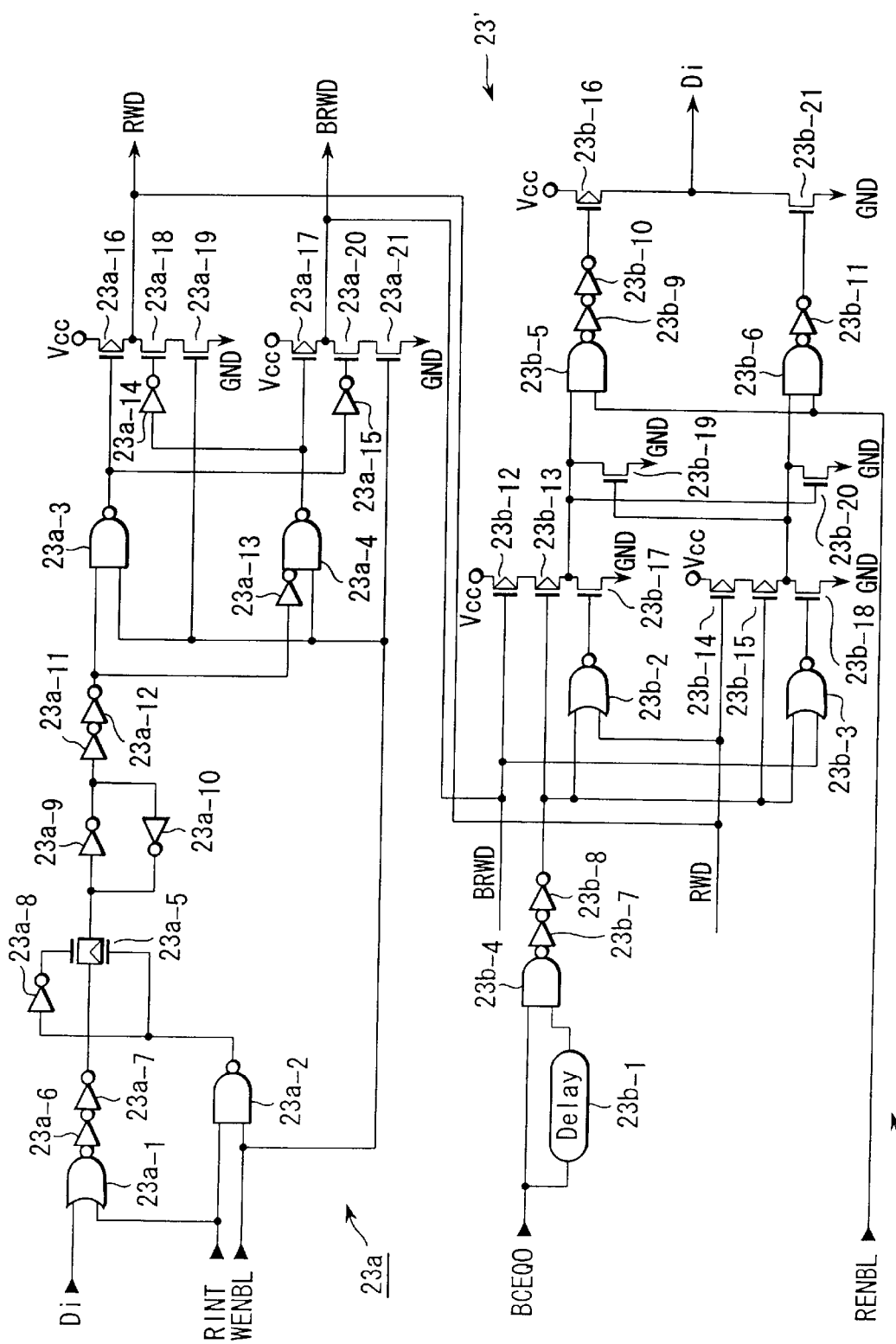
FIG. 6 is a circuit diagram showing an example of arrangement of data input/output buffer circuits in the semiconductor memory chip shown in FIG. 1.

The data input/output buffer circuits 23 include a plurality of data input/output buffer circuits 23'. FIG. 6 shows an example of one of the data input/output buffer circuits 23'. Each of the circuits 23' includes a first circuit 23a and a second circuit 23b.

The first circuit 23a serves to acquire data RWD and BRWD from data Di in response to signals RINT and WENBL and includes one NOR circuit $23a_{-1}$, three NAND circuits $23a_{-2}$, $23a_{-3}$ and $23a_{-4}$, one transfer gate $23a_{-5}$, ten inverter circuits $23a_{-6}$, $23_{-7}$, . . . , and $23a_{-15}$, two p-channel MOS transistors $23a_{-16}$ and $23a_{-17}$, and four n-channel MOS transistors $23a_{-18}$, $23a_{-19}$, $23a_{-20}$, and $23a_{-21}$.

The second circuit 23b serves to acquire data Di from data RWD and BRWD in response to signals BCEQO and RENBL and includes one delay circuit $23b_{-1}$, two NOR circuits $23b_{-2}$ and $23b_{-3}$, three NAND circuits $23b_{-4}$, $23b_{-5}$ and $23b_{-6}$, five inverter circuits $23b_{-7}$, $23b_{-8}$, . . . , and $23b_{-11}$, five p-channel MOS transistors $23b_{-12}$, $23b_{-13}$, . . . and $23b_{-16}$, and five n-channel MOS transistors $23b_{-17}$, $23b_{-18}$, . . . and $23b_{-21}$.

Actually, these data input/output buffer circuits 23' are provided for their respective data input/output terminals I/Oi.

Switch circuits 31 are connected to the data input/output buffer circuits 23. In other words, the circuits 23 receive data Di from the switch circuits 31 and then output it from the data input/output terminals I/Oi (e.g., in the read monitor test mode).

The internal control signal generation circuit 21, operation control circuit 22, data input/output buffer circuits 23, data write/read control circuit 24, row predecoder circuits 25, data buffer circuit 27, and test control circuit (test mode setting circuit) 32 are connected to the switch circuits 31.

The switch circuits 31 receive an output test signal RWTEST from the test control circuit 32 in, for example, the read monitor test mode. Thus, the circuits 31 convert a plurality of timing control signals, which are supplied as input signals Si (i=1 to i), into data Di and supply it to the data input/output buffer circuits 23. The timing control signals are output from the data input/output terminals I/Oi as data Di.

Figure 7:
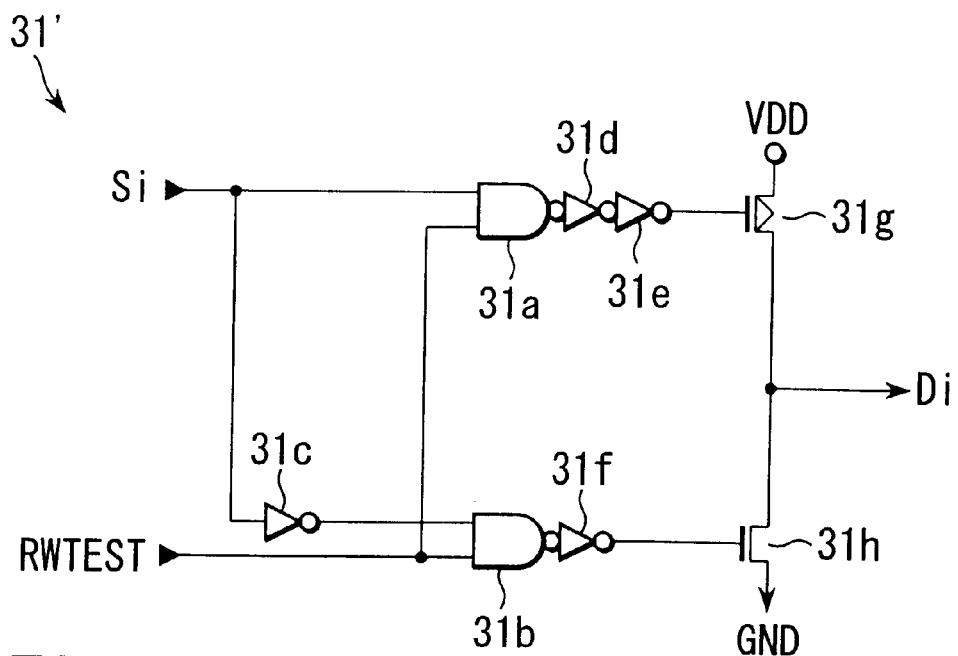
FIG. 7 is a circuit diagram showing an example of arrangement of switch circuits in the semiconductor memory chip shown in FIG. 1.

The switch circuits 31 include a plurality of switch circuits 31'. FIG. 7 shows an example of one of the switch circuits 31'. The switch circuits 31' are provided for their respective data input/output terminals I/Oi. Each of the switch circuits 31' includes two NAND circuits 31a and 31b, four inverter circuits 31c, 31d, 31e and 31f, one p-channel MOS transistor 31g, and one n-channel MOS transistor 31h (first tristate circuit).

An input signal Si is supplied to one input terminal of the NAND circuit 31a and also supplied to one input terminal of the NAND circuit 31b via the inverter circuit 31c. A signal RWTEST is supplied to the other input terminals of the NAND circuits 31a and 31b. The output terminal of the NAND circuit 31a is connected to the gate of the p-channel MOS transistor 31g through the inverter circuits 31d and 31e. The source of the transistor 31g is connected to an external power supply VDD. The output terminal of the NAND circuit 31b is connected to the gate of the n-channel MOS transistor 31h through the inverter circuit 31f. The source of the transistor 31h is grounded (GND). The drains of both the transistors 31g and 31h are connected to each other. Data Di is output from the common drain of the transistors 31g and 31h.

The p-channel MOS transistor 31g and n-channel MOS transistor 31h both turn off in the normal read mode and normal write mode (the level of signal RWTEST is low in both the modes). Thus, the data Di output from the switch circuits 31' is brought into a high-impedance state (Di=Hi–z). The data Di depends upon the input signal Si in the read monitor test mode (the level of signal RWTEST is high). If the level of the input signal Si is high (H), that of data Di becomes high. If the level of the input signal Si is low (L), that of data Di becomes low.

According to the first embodiment, signals RINT, RAS2, XVLD, BSEBL, PLEBL, SAEBL, CENB2, and BCEQO and data DQ(0), BDQ(0), RWD(0), and BRWD(0) can simultaneously be monitored as timing control signals in, for example, the normal read mode. Of the input signals Si(i=1 to 15) of the switch circuits 31', the input signals S(1), S(2), S(3), S(4), S(5), S(6), S(7), S(8), S(9), S(10), S(11) and S(12) correspond to RINT, RAS2, XVLD, BSEBL, PLEBL, SAEBL, CENB2, BCEQO, DQ(0), BDQ(0), RWD(0) and BRWD(0), respectively.

Aside from the timing control signals, the cell data actually read out of the memory cell array 11 can be output from the data input/output terminals I/Oi.

A test entry circuit (not shown), the switch circuits 31, etc. are connected to the test control circuit 32.

Figure 8:
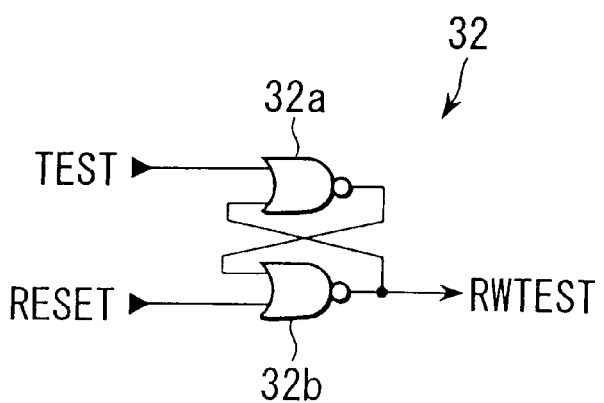
FIG. 8 is a circuit diagram showing an example of arrangement of a test control circuit in the semiconductor memory chip shown in FIG. 1.

FIG. 8 shows an example of arrangement of the test control circuit 32 described above. The circuit 32 includes two NOR circuits 32*a* and 32*b*.

A signal TEST is supplied to one input terminal of the NOR circuit 32*a*. A signal RESET is supplied to one input terminal of the NOR circuit 32*b*. An output of the NOR circuit 32*a* is supplied to the other input terminal of the NOR circuit 32*b*. An output of the NOR circuit 32*b* is supplied to the other input terminal of the NOR circuit 32*a* and produced as a signal RWTEST.

The test control circuit 32 receives a test signal (e.g., pulse signal) TEST from the test entry circuit in the read monitor test mode. In response to the signal, the circuit 32 generates a signal RWTEST (high level) and outputs it to the switch circuits 31. On the other hand, the test control circuit 32 stops the signal RWTEST from being output to the switch circuits 31 (the level of RWTEST is low) when the test mode is reset or when the circuit 32 receives a reset signal RESET from the test entry circuit. Consequently, the semiconductor memory device (chip) can operate in the normal operating mode.

The semiconductor memory chip so configured can be set in, for example, the read monitor test mode. In this test mode, a plurality of timing control signals in the internal operation in the normal read mode can be monitored at the same time. Upon receiving a test signal TEST, the test control circuit 32 performs a test entry operation and thus outputs a signal RWTEST (H) to the switch circuits 31. An output path of the timing control signals is therefore connected to the data input/output terminals I/Oi. In other words, the switch circuits 31 are connected to the data input/output terminals I/Oi through the data input/output buffer circuits 23. Then, the device is brought into an output disable state. For example, when the device is in an active state (the level of CEB is low), the output and input of cell data are inhibited (the levels of OEB and WEB are high). Thus, data Di corresponding to each of the input signals Si is supplied to the data input/output buffer circuits 23 from the switch circuits 31. Consequently, a plurality of timing control signals to be monitored can simultaneously be output from the data input/output terminals I/Oi.

In the first embodiment, signals RINT, RAS2, XVLD, BSEBL, PLEBL, SAEBL, CENB2, and BCEQO and data DQ(0), BDQ(0), RWD(0), and BRWD(0) are output from the data input/output terminals I/O(1), I/O(2), I/O(3), I/O(4), I/O(5), I/O(6), I/O(7), I/O(8), I/O(9), I/O(10), I/O(11), and I/O(12), respectively, on a priority basis, without conflicting with the cell data. The timing control signals can thus be output from the data input/output terminals I/Oi, with the result that the internal operation of the semiconductor memory chip can efficiently be analyzed (the characteristics can be verified and evaluated) after the chip is packaged.

As described above, the plurality of timing control signals in the chip can be monitored at the same time even after the chip is packaged. In other words, the timing control signals in the chip can efficiently be output from the plurality of data input/output terminals used for input and output of cell data. It is thus possible to easily and accurately evaluate the timing of an internal operation, a delay in signal, etc. even after the chip is packaged. Consequently, the internal operation of the semiconductor memory chip, such as an operating margin, can be analyzed with high precision at low cost in a short time without forming any sample chip for evaluation or using any expensive apparatus exclusively for evaluation.

Since the plurality of timing control signals can be output at the same time, a relationship in timing between the timing control signals can be analyzed. For example, the semiconductor memory chip of the present invention is favorable for acquiring a large amount of data in order to make evaluations in consideration of variations in lots and wafers.

According to the first embodiment in particular, the switch circuits 31 and test control circuit 32 are simply added and the existing semiconductor memory chip need not be modified extensively. Consequently, the chip area and cost can be prevented from increasing, which is advantageous.

Figure 9A:
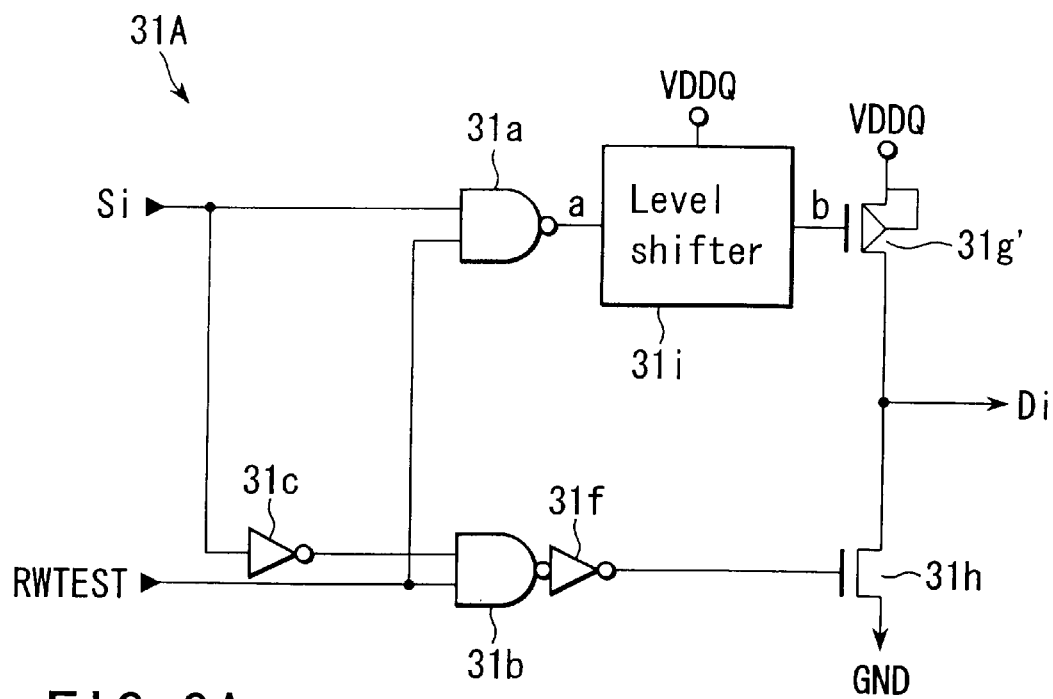
FIGS. 9A and 9B are circuit diagrams each showing another example of arrangement of the test control circuit.
Figure 9B:
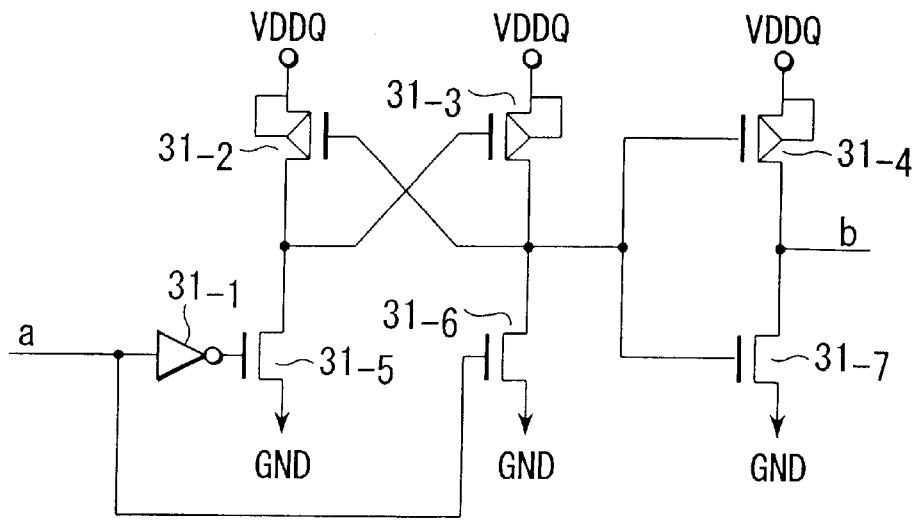

The switch circuits 31 are not limited to the foregoing arrangement. The switch circuits 31' can be replaced with a switch circuit 31A shown in FIG. 9A. The switch circuit 31A employs a power supply voltage VDDQ exclusively for the output buffer circuits, which differs from the external power supply voltage. VDD. In this case, a level shift circuit (level shifter) 31*i* is inserted as a voltage switch circuit between the output terminal (a) of the NAND circuit 31*a* and the gate (b) of a p-channel MOS transistor 31*g'* that forms a second tristate circuit by a series connection with the n-channel MOS transistor 31*h*. In other words, the switch circuit 31A includes the level shift circuit 31*i* in place of the inverter circuits 31*d* and 31*e* of the switch circuit 31' shown in FIG. 7. The level shift circuit 31*i* is used to switch between the power supply voltage VDD and VDDQ and, as shown in FIG. 9B, includes one inverter circuit $31_{-1}$, three p-channel MOS transistors $31_{-2}$, $31_{-3}$ and $31_{-4}$, and three n-channel MOS transistors $31_{-5}$, $31_{-6}$ and $31_{-7}$.

Figure 10A:
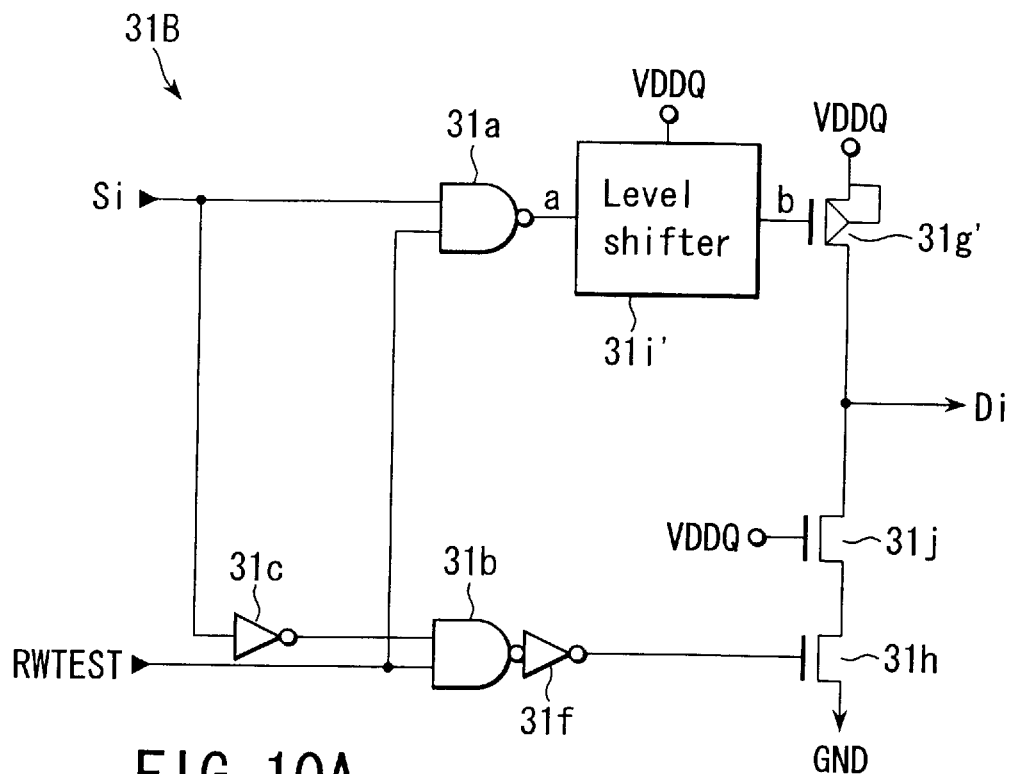
FIGS. 10A and 10B are circuit diagrams each showing still another example of arrangement of the test control circuit.
Figure 10B:
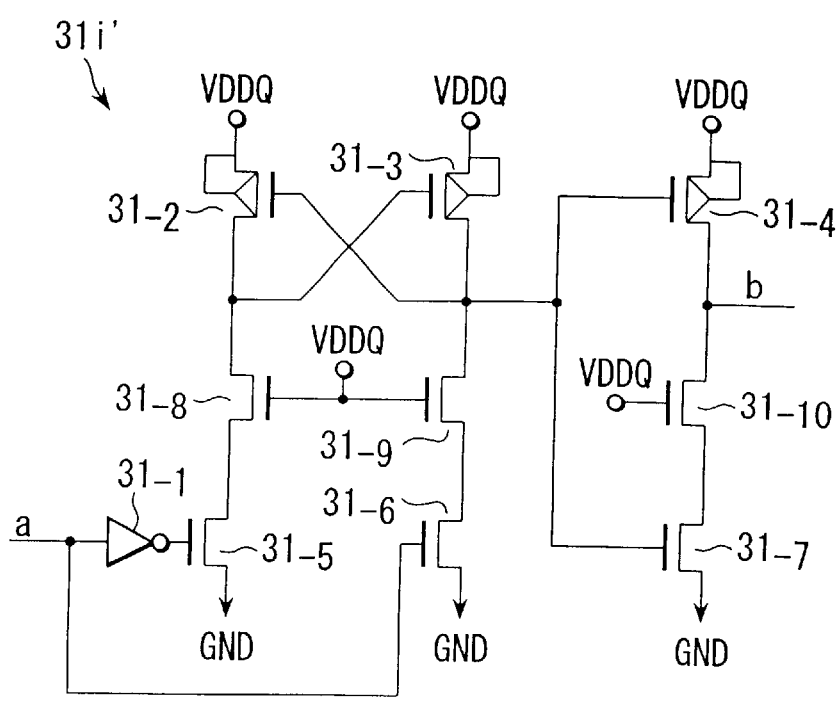

FIG. 10A shows an arrangement of a switch circuit 31B as another example of the switch circuits 31'. There is a semiconductor memory chip in which an internal circuit voltage Vin and a power supply voltage VDDQ exclusively for the output buffer circuits are selectively used in order to increase the speed of the internal operation and stabilize the operation. It is feared that transistors used in this type of semiconductor memory chip will decrease in breakdown voltage in accordance with the high performance such as low voltage and high speed. In the switch circuit 31B adopting such a transistor, an n-channel MOS transistor (protecting transistor) 31*j* is connected in series to an n-channel MOS transistor 31*h*, as shown in FIG. 10A. A positive potential such as the power supply voltage VDDQ is applied to the gate of the n-channel MOS transistor 31*j*. Similarly, n-channel MOS transistors (protecting transistors) $31_{-8}$, $31_{-9}$ and $31_{-10}$ are connected in series to their respective n-channel MOS transistors $31_{-5}$, $31_{-6}$ and $31_{-7}$ even in a level shift circuit 31*i'*, as shown in FIG. 10B. The power supply voltage VDDQ (positive potential) is applied to the gates of the n-channel MOS transistors $31_{-8}$, $31_{-9}$ and $31_{-10}$. Thus, the breakdown voltage of the n-channel MOS transistors 31*h*, $31_{-5}$, $31_{-6}$ and $31_{-7}$ are improved, with the result that the breakdown voltage is improve in the inverter structure.

Needless to say, the same advantage as that in the case of the switch circuit 31' can be obtained if one of the switch circuits 31A and 31B is used.

In the first embodiment, the timing control signals in the normal read mode can be monitored. Naturally, the timing control signals in the normal write mode can easily be monitored.

Second Embodiment

Figure 11:
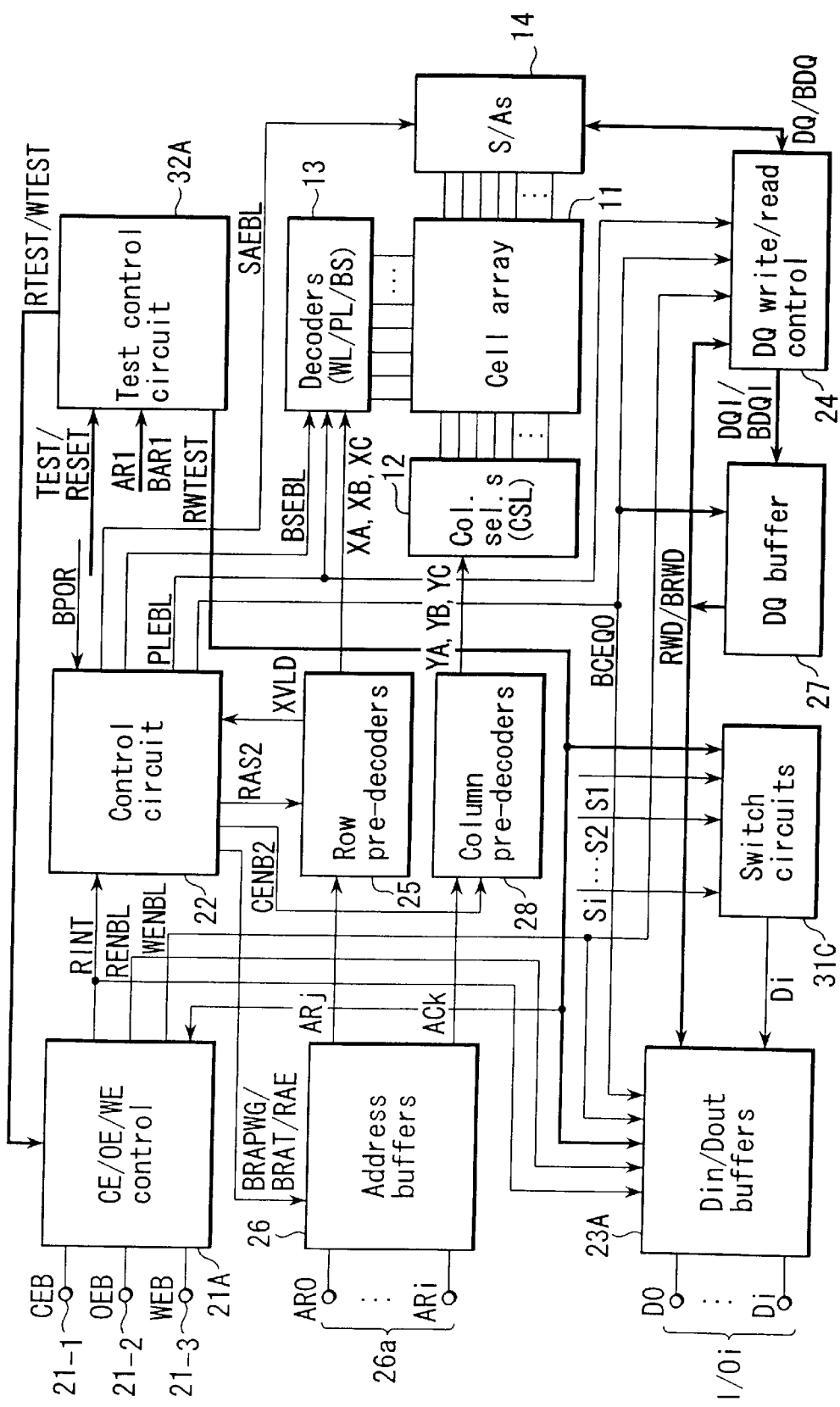
FIG. 11 is a block diagram showing an example of a configuration of a semiconductor memory device (semiconductor memory chip) according to a second embodiment of the present invention.

FIG. 11 shows an example of a configuration of a semiconductor memory device (semiconductor memory chip)

according to a second embodiment of the present invention. In the semiconductor memory device shown in FIG. 11, timing control signals in both the normal read mode and normal write mode can be monitored by bringing the device into a specific state when it is set in a test mode. The same components as those of the first embodiment are denoted by the same reference numerals and their detailed descriptions are omitted.

As illustrated in FIG. 11, a test control circuit (test mode setting circuit) 32A outputs an output test signal RWTEST to an internal control signal generation circuit 21A, data input/output buffer circuits 23A, and switch circuits 31C. The test control circuit 32A includes a state control circuit for supplying test signals RTEST and WTEST to the internal control signal generation circuit 21A.

Figure 12:
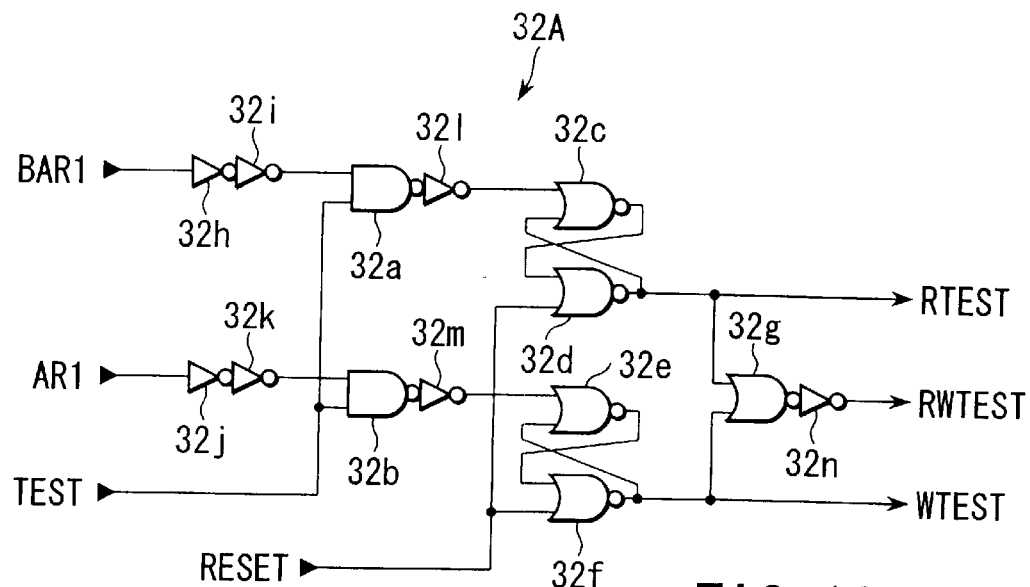
FIG. 12 is a circuit diagram showing an example of arrangement of a test control circuit in the semiconductor memory chip shown in FIG. 11.

FIG. 12 shows an example of arrangement of the test control circuit 32A. The test control circuit 32A includes two NAND circuits 32a and 32b, five NOR circuits 32c, 32d, ..., and 32g, and seven inverter circuits 32h, 32i, ..., and 32n.

More specifically, a signal BAR(1) is supplied to one input terminal of the NAND circuit 32a via the inverter circuits 32h and 32i. A signal TEST is supplied to the other input terminal of the NAND circuit 32a and one input terminal of the NAND circuit 32b. A signal AR(1) is supplied to the other input terminal of the NAND circuit 32b via the inverter circuits 32j and 32k. An output of the NAND circuit 32a is supplied to one input terminal of the NOR circuit 32c via the inverter circuit 32l. An output of the NOR circuit 32c is supplied to one input terminal of the NOR circuit 32d. An output of the NOR circuit 32d is produced as a signal RTEST and supplied to the other input terminal of the NOR circuit 32c and one input terminal of the NOR circuit 32g. An output of the NAND circuit 32b is supplied to one input terminal of the NOR circuit 32e via the inverter circuit 32m. An output of the NOR circuit 32e is supplied to one input terminal of the NOR circuit 32f. A signal RESET is supplied to the other input terminals of the NOR circuits 32d and 32f. An output of the NOR circuit 32f is produced as a signal WTEST and supplied to the other input terminal of the NOR circuit 32e and the other input terminal of the NOR circuit 32g. An output of the NOR circuit 32g is produced as a signal RWTEST through the inverter circuit 32n.

When signal TEST is input, the level of signal RTEST becomes high (read monitor test mode) if the level of signal AR(1) is low and that of signal BAR(1) is high. When signal TEST is input, the level of signal WTEST becomes high (write monitor test mode) if the level of signal AR(1) is high and that of signal BAR(1) is low. The level of signal RWTEST becomes high if the level of one of signals RTEST and WTEST is high. When signal RESET is input, the levels of signals RTEST, WTEST and RWTEST all become low.

Figure 13:
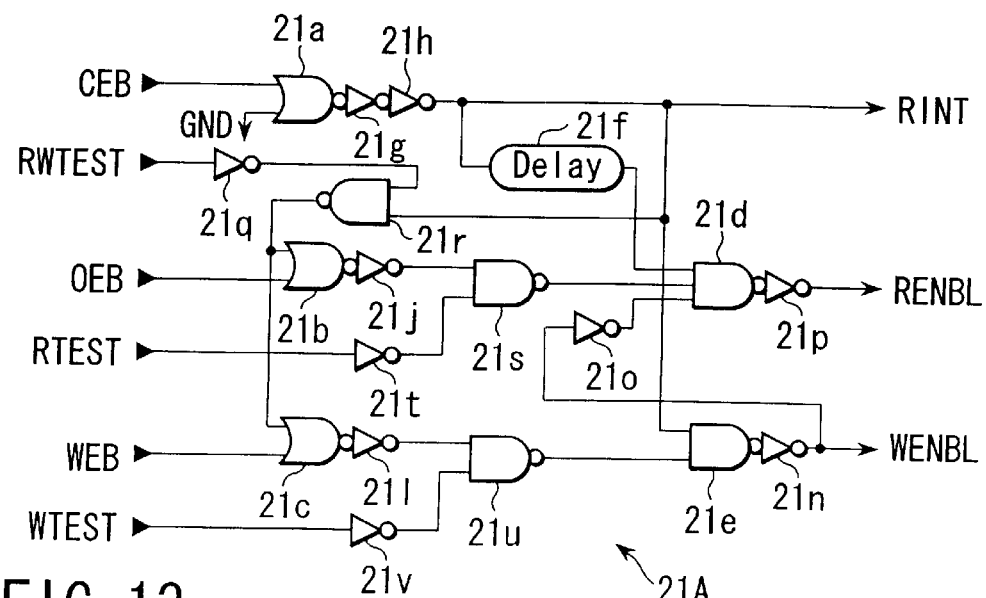
FIG. 13 is a circuit diagram showing an example of arrangement of an internal control signal generation circuit in the semiconductor memory chip shown in FIG. 11.

FIG. 13 shows an example of arrangement of the internal control signal generation circuit 21A. A signal CEB is supplied to one input terminal of a NOR circuit 21a. The other input terminal of the NOR circuit 21a is grounded (GND). An output of the NOR circuit 21a is produced as a signal RINT through inverter circuits 21g and 21h. The output signal RINT of the inverter circuit 21h is supplied to a first input terminal of a NAND circuit 21d via a delay circuit 21f. The output signal RINT of the inverter circuit 21h is also supplied to one input terminal of each of NAND circuits 21e and 21r. A signal RWTEST is supplied to the other input terminal of the NAND circuit 21r through an inverter circuit 21q. An output of the NAND circuit 21r is supplied to one input terminal of each of NOR circuits 21b and 21c. A signal OEB is supplied to the other input terminal of the NOR circuit 21b. An output of the NOR circuit 21b is supplied to one input terminal of a NAND circuit 21s through an inverter circuit 21j. A signal RTEST is supplied to the other input terminal of the NAND circuit 21s through an inverter circuit 21t. An output of the NAND circuit 21s is supplied to a second input terminal of the NAND circuit 21d. A signal WEB is supplied to the other input terminal of the NOR circuit 21c. An output of the NOR circuit 21c is supplied to one input terminal of a NAND circuit 21u through an inverter circuit 21l. A signal WTEST is supplied to the other input terminal of the NAND circuit 21u through an inverter circuit 21v. An output of the NAND circuit 21u is supplied to the other input terminal of the NAND circuit 21e. An output of the NAND circuit 21e is produced as a signal WENBL through an inverter circuit 21n and also supplied to a third input terminal of the NAND circuit 21d through an inverter circuit 21o. An output of the NAND circuit 21d is produced as a signal RENBL through an inverter circuit 21p.

When the level of signal RTEST is high, the internal control signal generation circuit 21A receives a low-level signal CEB and outputs a high-level signal RENBL. Thus, the memory chip starts to perform a normal read operation as an internal operation. On the other hand, when the level of signal WTEST is high, the circuit 21A receives a low-level signal CEB and outputs a high-level signal WENBL. Thus, the memory chip starts to perform a normal write operation as an internal operation. In the second embodiment, the internal operation (read or write operation) is controlled only by setting of a test mode and timing of signal CEB, irrespective of signals OEB and WEB.

Figure 14:
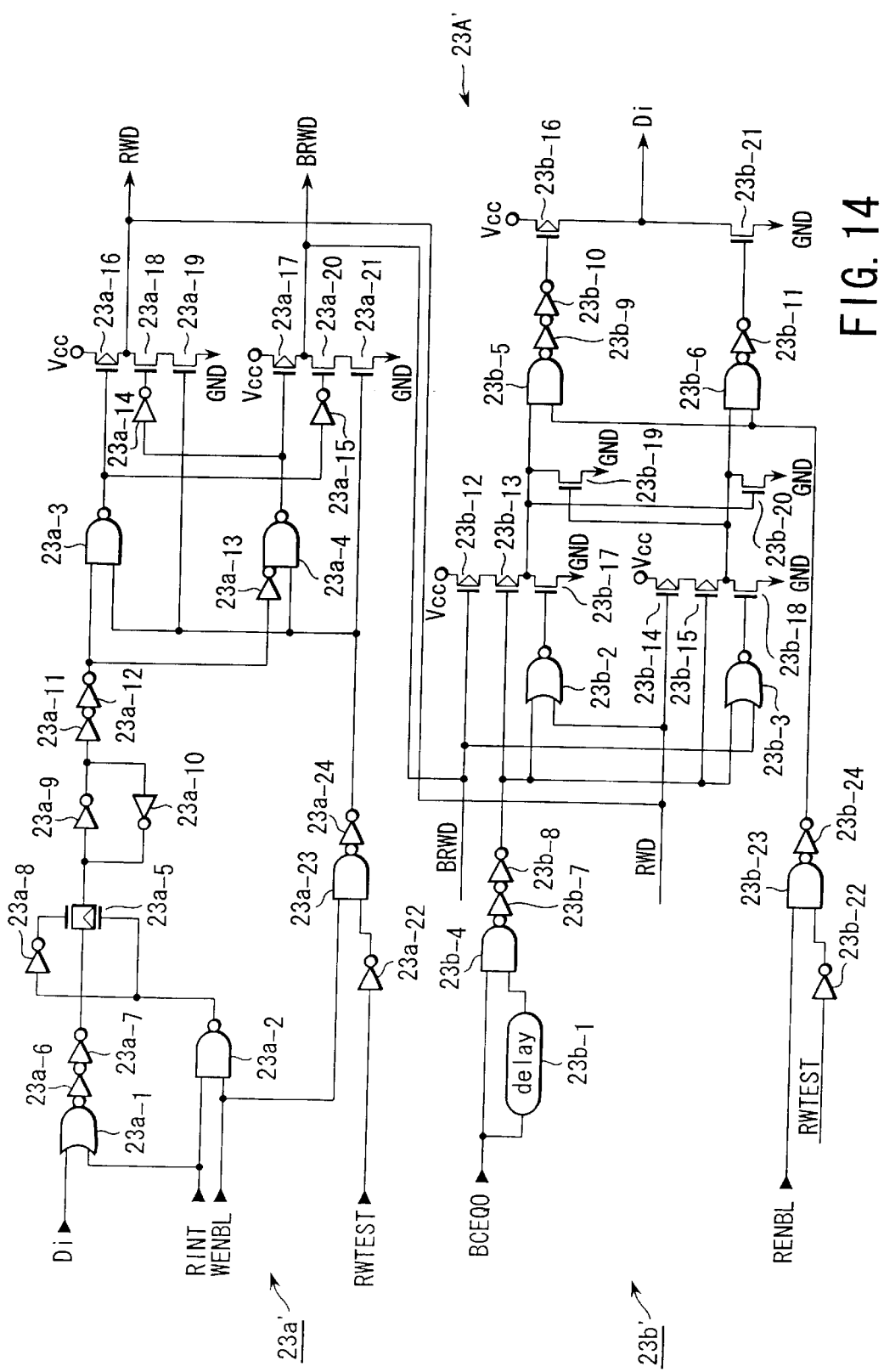
FIG. 14 is a circuit diagram showing an example of arrangement of data input/output buffer circuits in the semiconductor memory chip shown in FIG. 11.

The data input/output buffer circuits 23A include a plurality of data input/output buffer circuits 23A'. FIG. 14 shows an example of arrangement of one of the data input/output buffer circuits 23A'. Each of the circuits 23A' corresponds to the data input/output buffer circuit 23' shown in FIG. 6. In each circuit 23A', a signal RWTEST is supplied to first and second circuits 23a' and 23b' via inverter circuits $23a_{-22}$ and $23b_{-22}$. An output of NAND circuit $23a_{-23}$, which receives an output of the inverter circuit $23a_{-22}$ and a signal WENBL, is supplied to the NAND circuits $23a_{-3}$ and $23a_{-4}$ and the gates of n-channel MOS transistors $23a_{-19}$ and $23a_{-21}$ through an inverter circuit $23a_{-24}$ (path switching circuit). Further, an output of NAND circuit $23b_{-23}$, which receives an output of the inverter circuit $23b_{-22}$ and a signal RENBL, is supplied to the NAND circuits $23b_{-5}$ and $23b_{-6}$ through an inverter circuit $23b_{-24}$ (path switching circuit).

The above arrangement allows a path for inputting/outputting cell data from being disconnected from the data input/output terminals I/Oi in the test mode. Data Di from the switching circuits 31C can thus be prevented from conflicting with the cell data in the test mode without bringing the device into a disable state. The data input/output buffer circuit (first buffer circuit) 23' shown in FIG. 6 is connected to the data input/output terminal I/Oi (i=0 in this case) to/from which cell data is input/output, while the data input/output buffer circuit (second buffer circuit) 23A' shown in FIG. 14 is connected to the other data input/output terminals I/Oi (i=1 to 14 in this case) from which at least the timing control signals are output. Thus, the normal cell data as well as the timing control signals can be monitored in the test mode.

Figure 15:
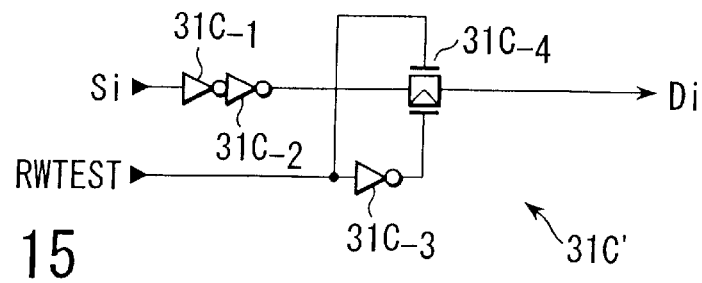
FIG. 15 is a circuit diagram showing an example of arrangement of switch circuits in the semiconductor memory chip shown in FIG. 11.

The switch circuits 31C include a plurality of switch circuits 31C'. FIG. 15 shows an example of arrangement of one of the switch circuits 31C'. Each of the switch circuits 31C' converts an input signal Si into data Di in the test mode (the level of signal RWTEST is high) and outputs it to the data input/output buffer circuits 23A and includes three inverter circuits $31C_{-1}$, $31C_{-2}$ and $31C_{-3}$ and one transfer gate $31C_{-4}$.

The semiconductor memory chip so configured can be set in both the read monitor test mode and write monitor test mode. A plurality of timing control signals, which are generated in the chip in the normal read mode, can simultaneously be monitored in the read monitor test mode. Upon receiving a test signal TEST, the test control circuit 32A performs a test entry operation. When the level of signal AR(1) is low (L), the circuit 32A outputs a high-level signal RTEST to the internal control signal generation circuits 21A and also outputs a high-level signal RWTEST to the internal control signal generation circuit 21A, data input/output buffer circuits 23A, and switch circuits 31C. Thus, an output path of the timing control signals is connected to the data input/output terminals I/Oi. In other words, the switch circuits 31C are connected to the data input/output terminals I/Oi through the data input/output buffer circuits 23A. Then, the device is brought into an active state (the level of signal CEB is low). Therefore, data D(1) to D(12) corresponding to the input signals (timing control signals in the normal read mode) S(1) to S(12) are supplied to the data input/output buffer circuits 23A. Consequently, the data D(1) to D(12) are output from the data input/output terminals I/O(1) to I/O(12) irrespective of signals OEB and WEB.

Figure 16:
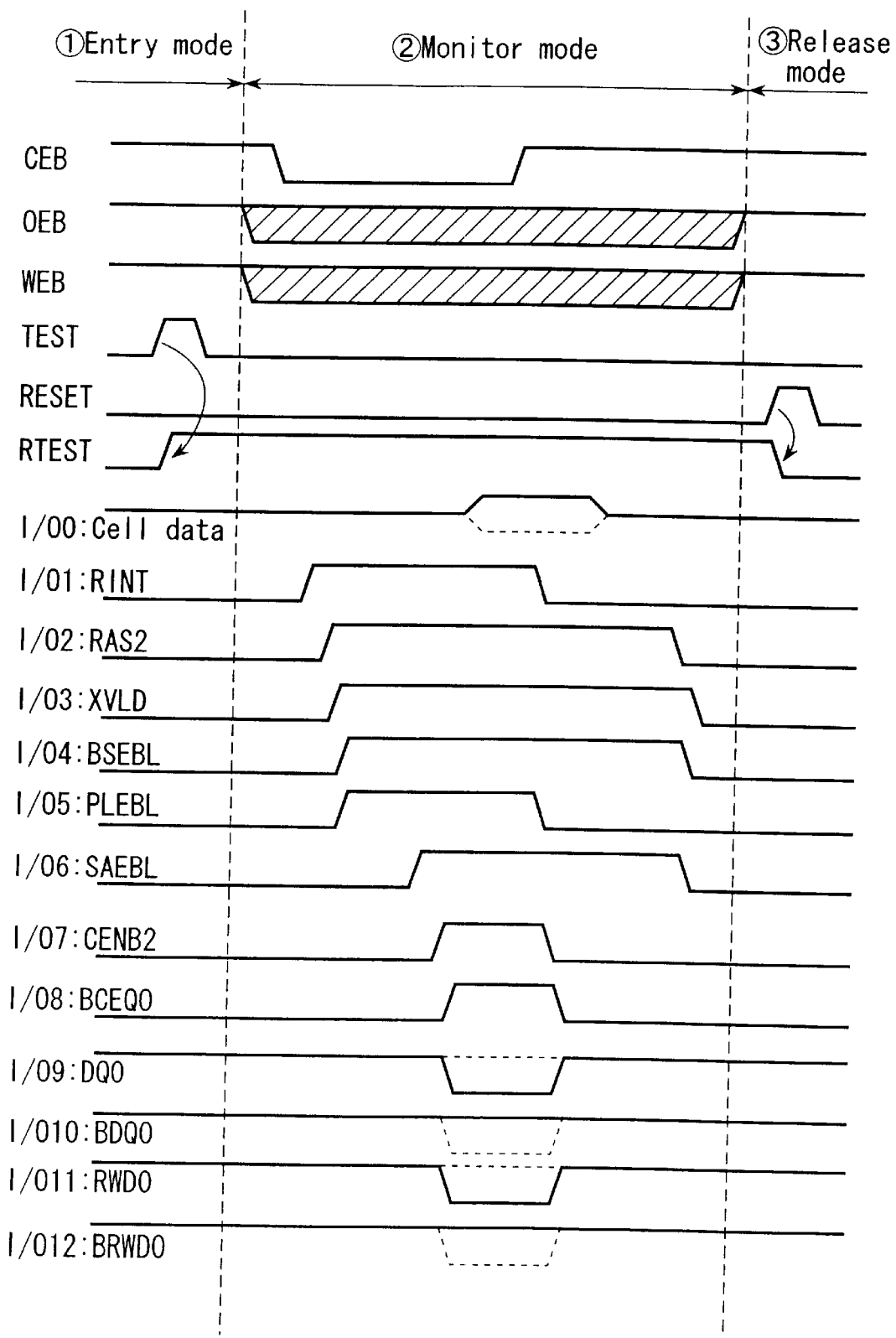
FIG. 16 is a signal waveform chart explaining a read operating monitor test mode in the semiconductor memory chip shown in FIG. 11.

FIG. 16 shows an example of a signal waveform in the read monitor test mode. In the second embodiment, the signals RINT (S(1)), RAS2 (S(2)), XVLD (S(3)), BSEBL (S(4)), PLEBL (S(5)), SAEBL (S(6)), CENB2 (S(7)), and BCEQO (S(8)) and data DQO (S(9)), BDQO (S(10)), RWDO (S(11)), and BRWDO (S(12)) are output from the data input/output terminals I/O(1), I/O(2), I/O(3), I/O(4), I/O(5), I/O(6), I/O(7), I/O(8), I/O(9), I/O(10), I/O(11), and I/O(12), respectively, as timing control signals in the normal read mode.

Similarly, when the level of signal AR(1) is high (H), the test control circuit 32A outputs a high-level signal WTEST to the internal control signal generation circuit 21A in the test entry operation. The circuit 23A also outputs a high-level signal RWTEST to the internal control signal generation circuit 21A, data input/output buffer circuits 23A, and switch circuits 31C. Thus, the switch circuits 31C supply data D(1) to D(12), which correspond to their respective input signals (timing control signals in the normal write mode), to the data input/output buffer circuits 23A. Data D(1) to D(12) are therefore output from the data input/output terminals I/O(1) to I/O(12), respectively.

In the second embodiment, the normal cell data is input/output to/from the data input/output terminal I/O(0). It is thus possible to easily confirm whether the internal operation in the test mode is performed by the timing of the normal operating mode.

Upon receiving a reset signal RESET from a test entry circuit (not shown) in the read monitor test mode or the write monitor test mode, the test control circuit 32A carries out a release operation (the levels of signals RTEST, WTEST and RWTEST are all low). Thus, the device can be operated in the normal operating mode.

As described above, substantially the same advantages as those of the first embodiment can be expected from the second embodiment. More specifically, a plurality of timing control signals to be monitored can simultaneously be output from a plurality of data input/output terminals used for input and output of cell data. It is thus possible to easily and accurately evaluate timing of an internal operation, a delay in signal, etc. using an established tester. The plurality of timing control signals in the normal write mode as well as in the normal read mode can sufficiently be output without conflicting with cell data. Consequently, the internal operation of the semiconductor memory chip, such as an operating margin, can be analyzed with high precision at low cost in a short time without forming any sample chip for evaluation or using any expensive apparatus exclusively for evaluation, and a large amount of data can be acquired.

Third Embodiment

Figure 17:
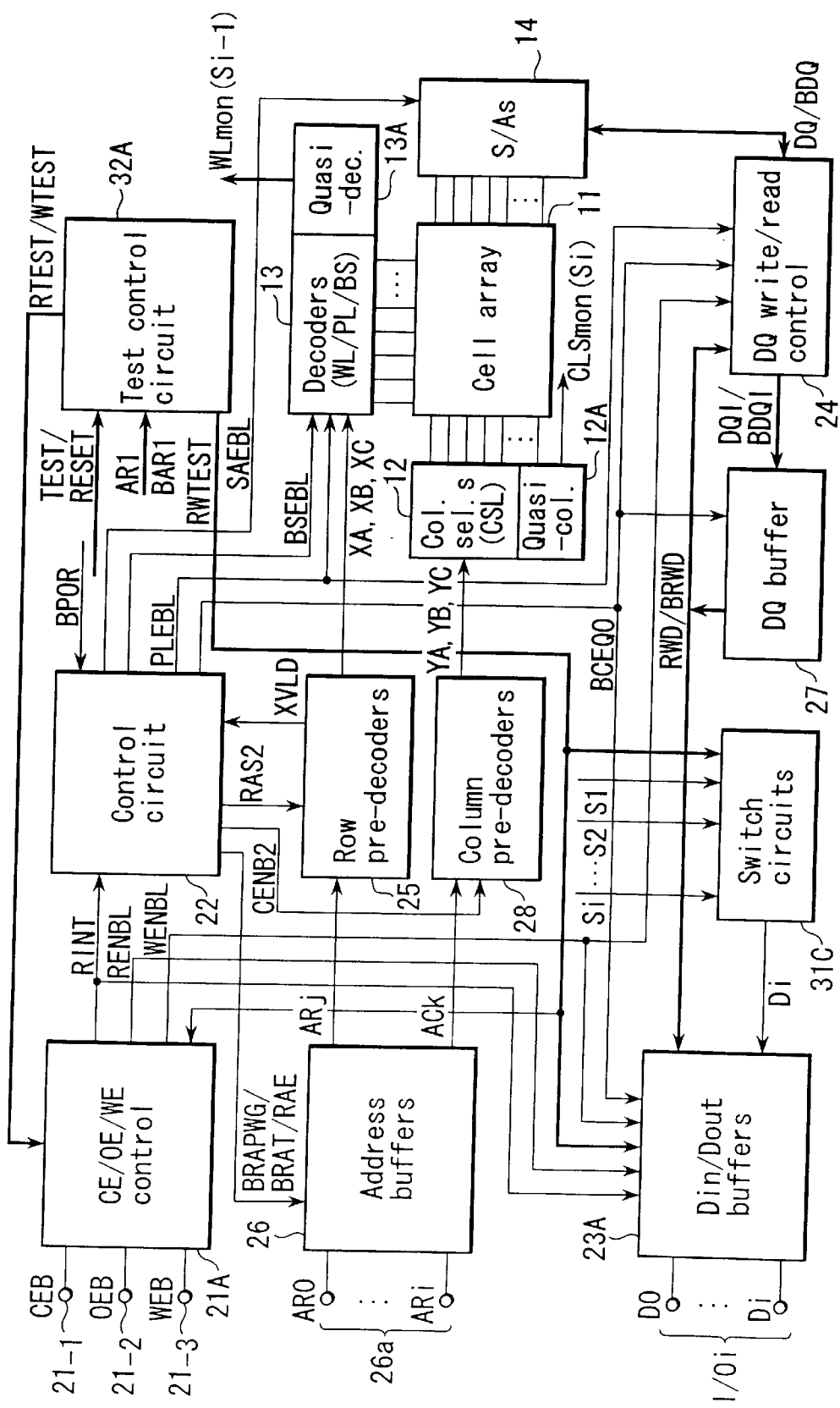
FIG. 17 is a block diagram showing an example of a configuration of a semiconductor memory device (semiconductor memory chip) according to a third embodiment of the present invention.

FIG. 17 shows an example of a configuration of a semiconductor memory device (semiconductor memory chip) according to a third embodiment of the present invention. The third embodiment allows a word line driving signal and a column select line driving signal to be monitored in the semiconductor memory chip illustrated in FIG. 11. The same components as those of the second embodiment are denoted by the same reference numerals and their detailed descriptions are omitted.

In order to monitor a word line driving signal and a column select line driving signal in the semiconductor memory chip, only one word line or column select line is usually selected from among a plurality of lines (e.g., 1024 word lines and 512 column select lines). In other words, all the word line driving signals and column select line driving signals cannot be monitored. If a specific word line driving signal is monitored, its capacity will differ from that of another word line. If an address is changed, the timing of signals cannot be evaluated.

In the third embodiment, as shown in FIG. 17, a quasi-row decoder circuit (Quasi-dec.) 13A is provided to monitor a quasi-word line driving signal WLmon and a quasi-column select circuit (Quasi-col.) 12A is provided to monitor a quasi-column select line driving signal CSLmon.

Figure 18:
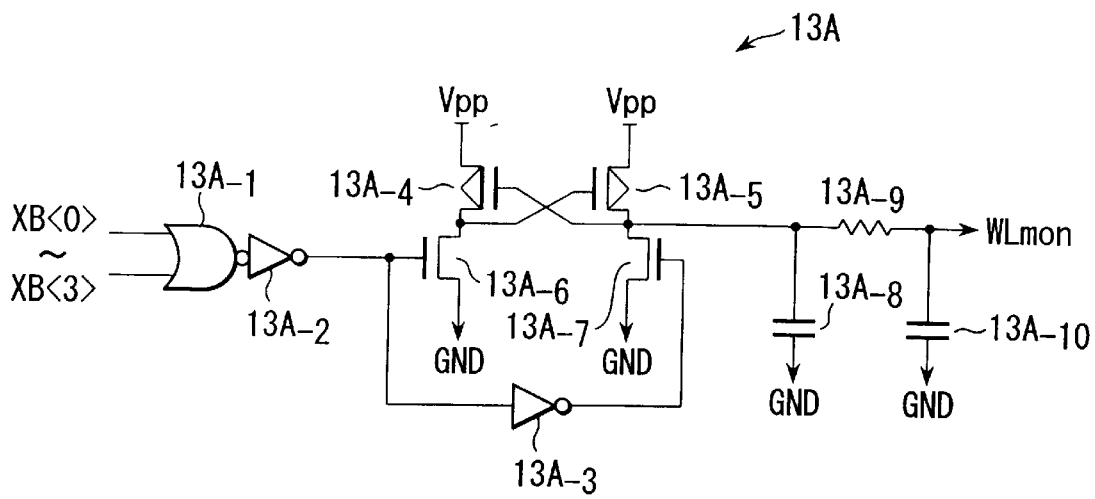
FIG. 18 is a circuit diagram showing an example of arrangement of a quasi-row decoder circuit in the semiconductor memory chip shown in FIG. 17.

FIG. 18 shows an example of arrangement of the quasi-row decoder circuit 13A. The quasi-row decoder circuit 13A is equivalent to the decoder circuits 13 described above. The circuit 13A generates a quasi-word line driving signal WLmon based on all addresses XB<0> to XB<3> and includes one NOR circuit $13A_{-1}$, two inverter circuits $13A_{-2}$ and $13A_{-3}$, two p-channel MOS transistors $13A_{-4}$ and $13A_{-5}$, two n-channel MOS transistors $13A_{-6}$ and $13A_{-7}$, two capacitors $13A_{-8}$ and $13A_{-10}$, and one resistor $13A_{-9}$. The capacitors $13A_{-8}$ and $13A_{-10}$ and resistor $13A_{-9}$ are arranged to make the capacity of the circuit 13A correspond to that of a normal word line.

Figure 19:
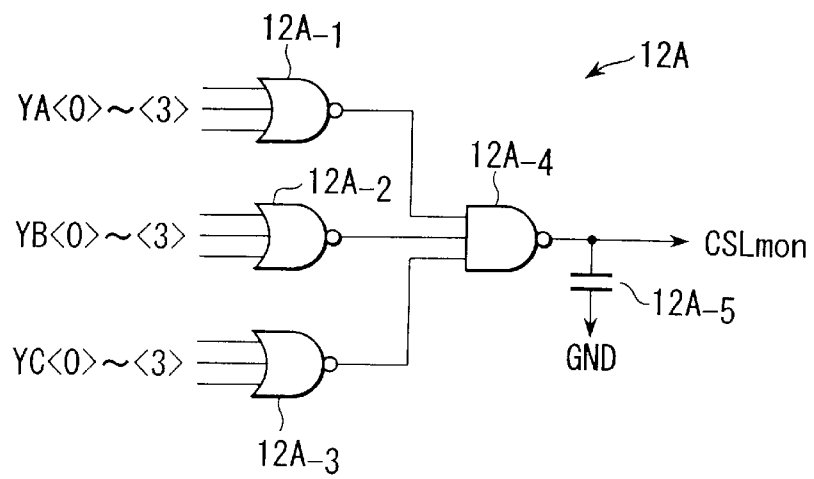
FIG. 19 is a circuit diagram showing an example of arrangement of a quasi-column select circuit in the semiconductor memory chip shown in FIG. 17.

FIG. 19 shows an example of arrangement of the quasi-column select circuit 12A. The quasi-column select circuit 12A is equivalent to the column select circuits 12 described above. The circuit 12A generates a quasi-column select line driving signal CSLmon based on all addresses YA<0> to <3>, YB<0> to <3>, and YC<0> to <3> and includes three NOR circuits $12A_{-1}$, $12A_{-2}$ and $12A_{-3}$, one NAND circuit $12A_{-4}$, and one capacitor $12A_{-5}$. The capacitor $12A_{-5}$ has parasitic capacitance.

Figure 20:
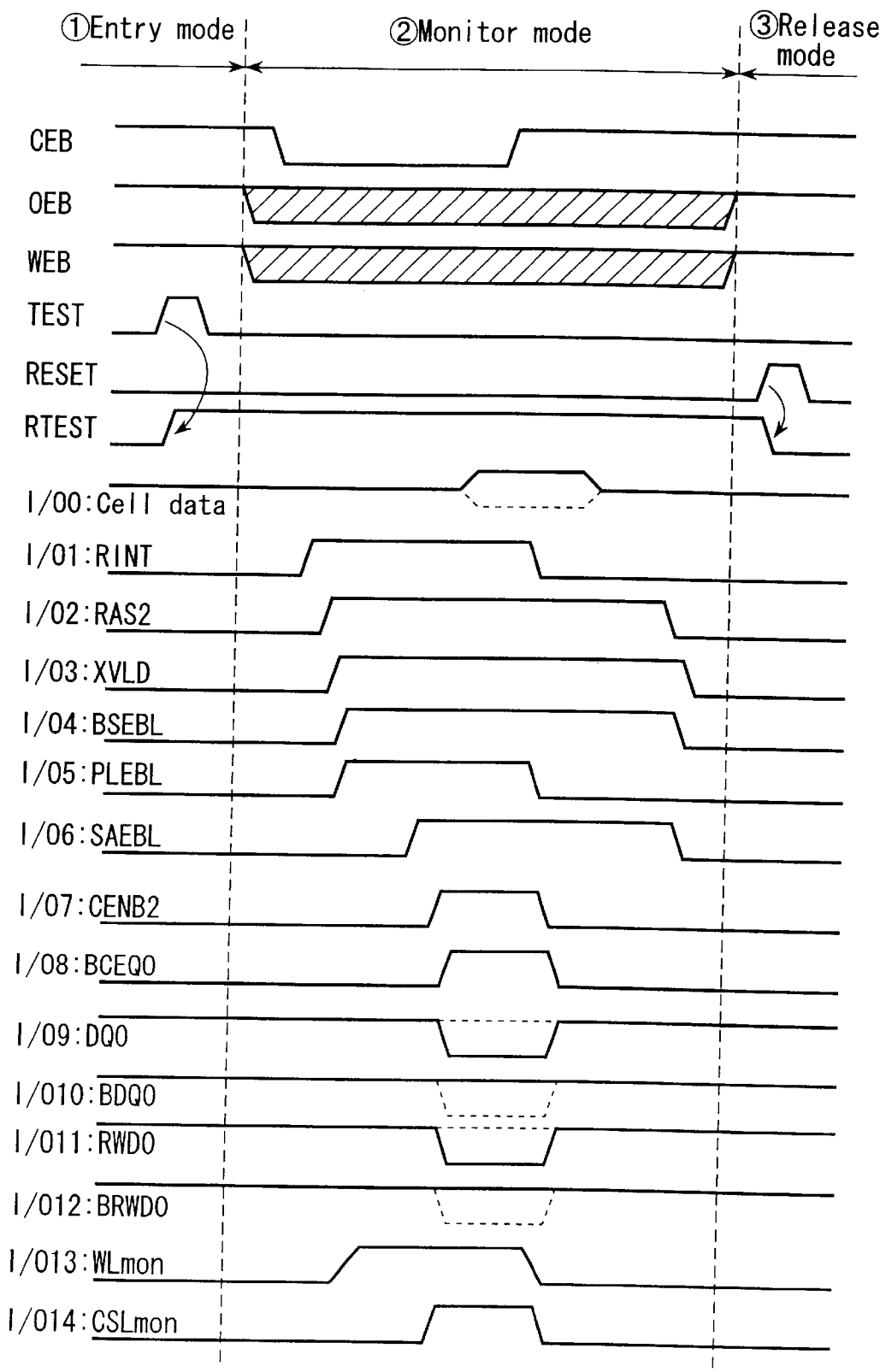
FIG. 20 is a signal waveform chart explaining a read operating monitor test mode in the semiconductor memory chip shown in FIG. 17.

FIG. 20 shows an example of a signal waveform in a read monitor test mode in the semiconductor memory chip according to the third embodiment. In this embodiment, a quasi-word line driving signal WLmon (Si-1) and a quasi-column select line driving signal CSLmon (Si) are output from the data input/output terminals I/O (13) and (14), respectively as timing control signals as well as twelve different timing control signals shown in FIG. 16.

The quasi-word line driving signal WLmon and quasi-column select line driving signal CSLmon can be monitored. Consequently, even when all the word line driving signals and all the column select line driving signals are difficult to monitor, they can be monitored in a quasi-manner.

The present invention is not limited to the above case where the quasi-word line driving signal WLmon and quasi-column select line driving signal CSLmon are monitored. For example, when it is difficult to monitor all of a plurality of signals in different select circuits for selecting a specific one from among the signals, they can easily be monitored by generating a quasi-signal from their equivalent circuit.

Fourth Embodiment

Figure 21:
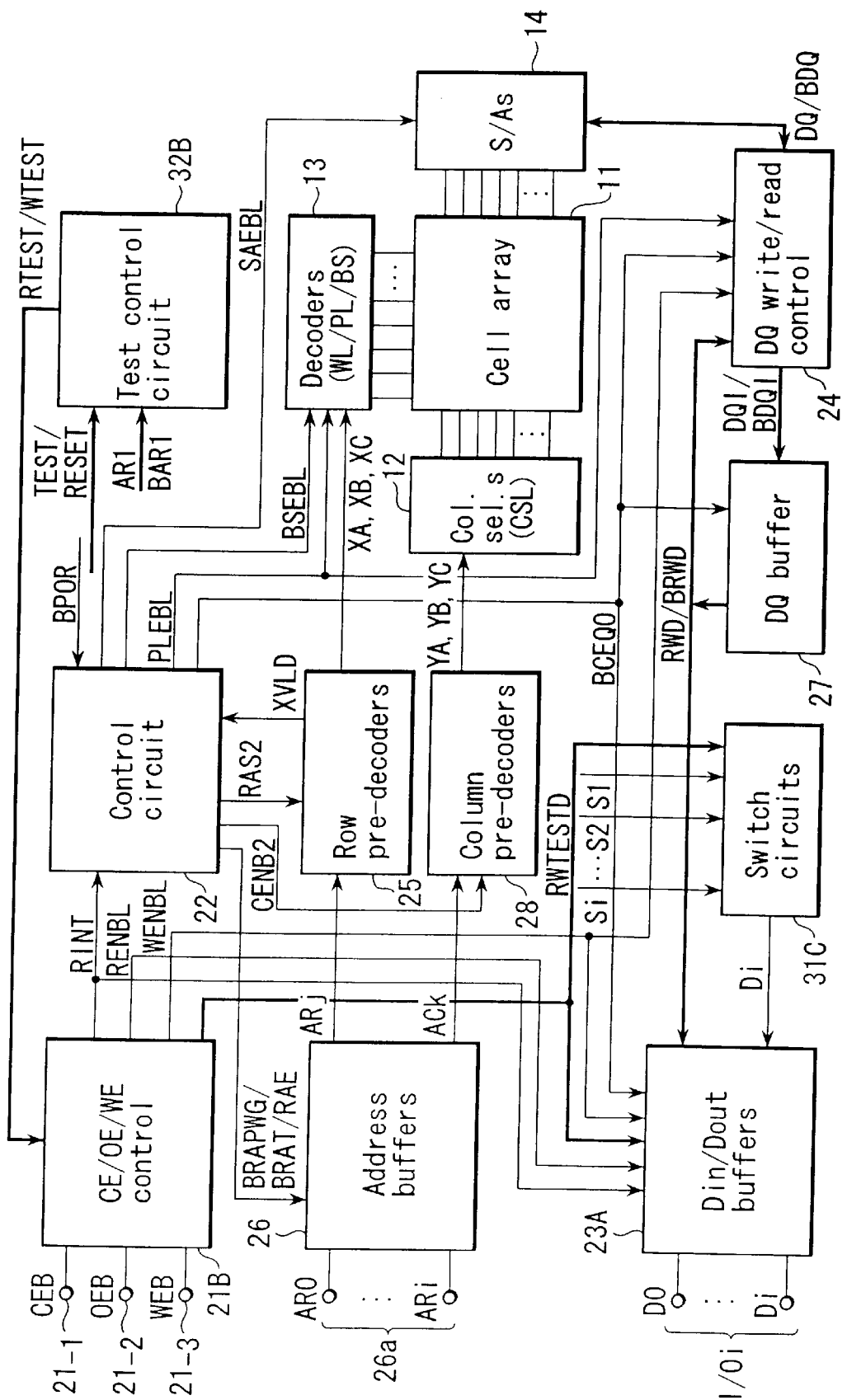
FIG. 21 is a block diagram showing an example of a configuration of a semiconductor memory device (semiconductor memory chip) according to a fourth embodiment of the present invention.

FIG. 21 shows an example of a configuration of a semiconductor memory device (semiconductor memory chip) according to a fourth embodiment of the present invention. The fourth embodiment allows a test mode and a normal operating mode to be switched in response to external control signals CEB, OEB and WEB. The same components as those of the second embodiment are denoted by the same reference numerals and their detailed descriptions are omitted.

In the fourth embodiment, an internal control signal generation circuit 21B supplies an output test signal RWTESTD to data input/output buffer circuits 23A and switch circuits 31C, as illustrated in FIG. 21. A test control circuit 32B generates only test signals RTEST and WTEST that are to be output to the internal control signal generation circuit 21B.

Figure 22:
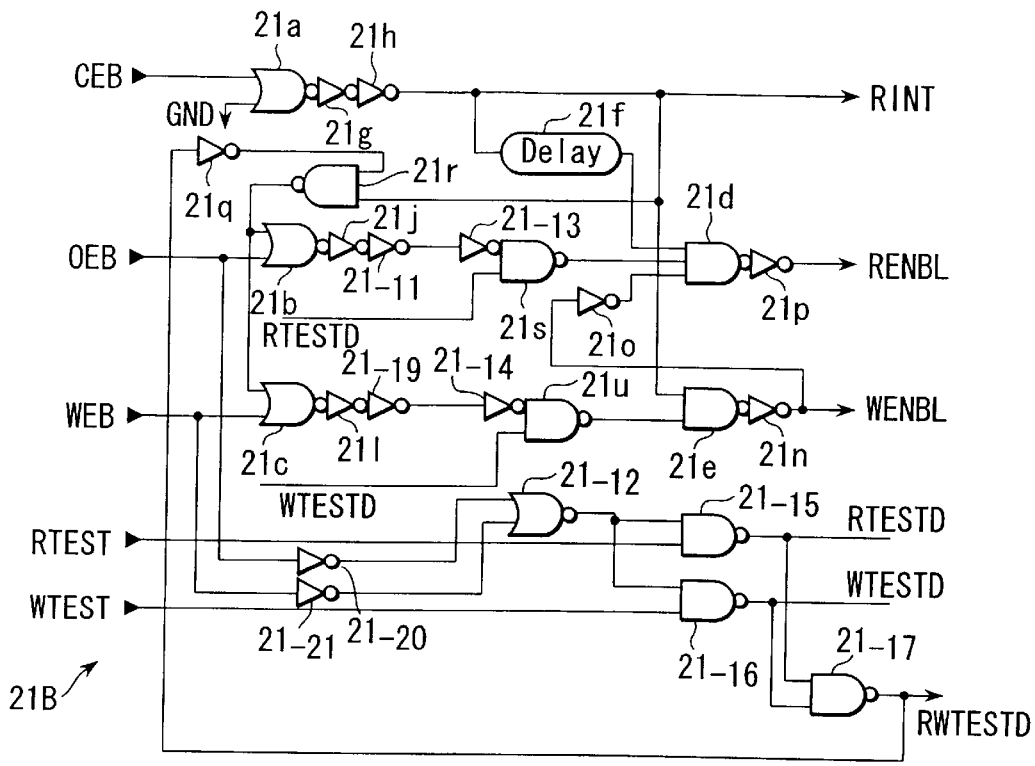
FIG. 22 is a circuit diagram showing an example of arrangement of an internal control signal generation circuit in the semiconductor memory chip shown in FIG. 21.

FIG. 22 shows an example of arrangement of the internal control signal generation circuit 21B. The circuit 21B generates signals RWTESTD, RTESTD and WTESTD as well as signals RINT, RENBL and WENBL and allows a test mode and normal read and write modes for reading/writing cell data to be switched in response to signals OEB and WEB.

The signal CEB is supplied to one input terminal of a NOR circuit 21a. The other input terminal of the NOR circuit 21a is grounded (GND). An output of the NOR circuit 21a is produced as the signal RINT through inverter circuits 21g and 21h. The output (signal RINT) of the inverter circuit 21h is supplied to a first input terminal of a NAND circuit 21d via a delay circuit 21f. The output (signal RINT) of the inverter circuit 21h is also supplied to one input terminal of each of NAND circuits 21e and 21r. The signal RWTESTD is supplied to the other input terminal of the NAND circuit 21r via an inverter circuit 21q. An output of the NAND circuit 21r is supplied to one input terminal of each of NOR circuits 21b and 21c. The signal OEB is supplied to the other input terminal of the NOR circuit 21b. An output of the NOR circuit 21b is supplied to one input terminal of a NAND circuit 21s through inverter circuits 21j, $21_{-11}$ and $21_{-13}$. The signal RTESTD is supplied to the other input terminal of the NAND circuit 21s. An output of the NAND circuit 21s is supplied to a second input terminal of the NAND circuit 21d. The signal WEB is supplied to the other input terminal of the NOR circuit 21c. An output of the NOR circuit 21c is supplied to one input terminal of a NAND circuit 21u via the inverter circuits 21l, $21_{-19}$ and $21_{-14}$. The signal WTESTD is supplied to the other input terminal of the NAND circuit 21u. An output of the NAND circuit 21u is supplied to the other input terminal of the NAND circuit 21e. An output of the NAND circuit 21e is produced as a signal WENBL through an inverter circuit 21n and supplied to a third input terminal of the NAND circuit 21d through an inverter circuit 21o. An output of the NAND circuit 21d is produced as the signal RENBL through an inverter circuit 21p.

The signal OEB is supplied to one input terminal of a NOR circuit $21_{-12}$ via an inverter circuit $21_{-20}$. The signal WEB is supplied to the other input terminal of the NOR circuit $21_{-12}$ via an inverter circuit $21_{-21}$. An output of the NOR circuit $21_{-12}$ is supplied to one input terminal of each of NAND circuits $21_{-15}$ and $21_{-16}$. The signal RTEST is supplied to the other input terminal of the NAND circuit $21_{-15}$. The signal WTEST is supplied to the other input terminal of the NAND circuit $21_{-16}$. An output of the NAND circuit $21_{-15}$ is produced as the signal RTESTD and supplied to one input terminal of a NAND circuit $21_{-17}$. An output of the NAND circuit $21_{-16}$ is produced as the signal WTESTD and supplied to the other input terminal of the NAND circuit $21_{-17}$. An output of the NAND circuit $21_{-17}$ is produced as a signal RWTESTD.

In the internal control signal generation circuit 21B, the levels of signals RTEST and WTEST are all low in the normal read mode for reading cell data and the normal write mode for writing cell data. The levels of signals RTESTD and WTESTD are high, and the level of signal RWTESTD is low. The signals RINT, RENBL and WENBL depend upon signals CEB, OEB and WEB. In a standby state, the level of signal CEB is high and the levels of signals RINT, RENBL and WENBL are low. In the read mode, the levels of signals CEB and OEB are low, the level of signal WEB is high, and the levels of signals RINT and RENBL are high, and the level of signal WENBL is low. In the write mode, the levels of signals CEB and WEB are low, the level of signal OEB is high, the levels of signals RINT and WENBL are high, and the level of signal RENBL is low. In the normal mode, the level of signal RWTESTD is low, and an output path of the timing control signals is not connected to the data input/output terminal I/Oi.

In the test mode, the level of signal CEB is low and the levels of signals OEB and WEB are high. In the read monitor test mode, the level of signal RTEST is high and that of signal RTESTD is low. The level of signal CEB is low, but that of RINT is high. As in the second embodiment, the level of signal RENBL is high and the internal operation is brought into a read operating state. On the other hand, in the write monitor test mode, the level of signal WTEST is high and that of signal WENBL is high, and the internal operation is brought into a write operating state. In both the test modes, the level of signal RWTESTD becomes high. Thus, an internal circuit (output path of cell data) separates from the internal control signal generation circuit 21B. In other words, the switch circuits 31C and data input/output terminals I/Oi are connected to each other in order to output data (timing control signal) Di from the switch circuits 31C.

If signal OEB or WEB is set at a low level at the same time when signal CEB is set at a low level, the levels of signals RTESTD and WTESTD become high. Consequently, signals RENBL and WENBL vary with external control signals CEB, OEB and WEB. If the level of signal OEB is low, that of signal RENBL is high. If the level of signal WEB is low, that of signal WENBL is high. The level of signal RWTESTD is low. The states of the data input/output buffer circuits 23A and switch circuits 31C are equal to those in the normal operation mode. Therefore, the device can read and write cell data. Even though the signals RTEST and WTEST are set at a high level in the test modes described above, they can be switched to the normal operation mode by setting the levels of signals OEB and WEB low.

Figure 23:
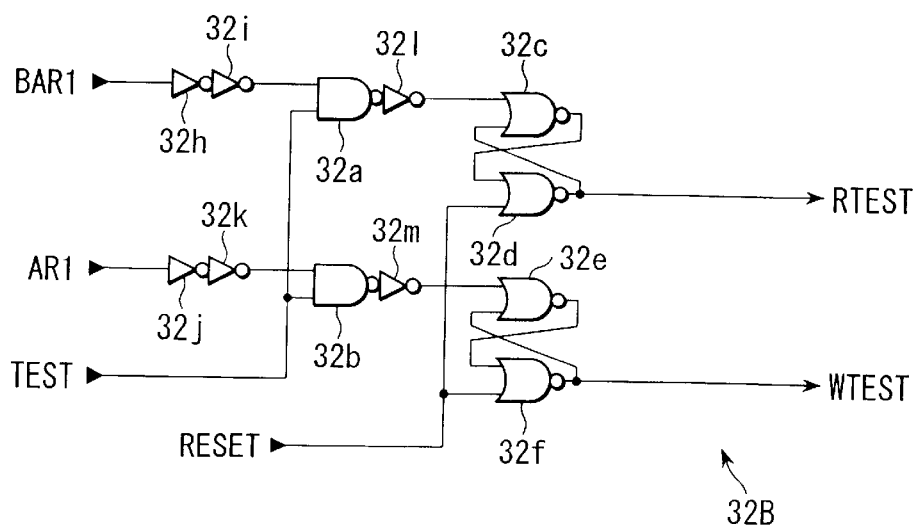
FIG. 23 is a circuit diagram showing an example of arrangement of a test control circuit in the semiconductor memory chip shown in FIG. 21.

FIG. 23 shows an example of arrangement of the test control circuit 32B. As in the test control circuit 32A shown in FIG. 12, an output of the NOR circuit 32d is produced as a signal RTEST and that of the NOR circuit 32f is produced as a signal WTEST. However, the circuit 32B includes neither the NOR circuit 32g nor inverter circuit 32n which generates the signal RWTEST.

The switch circuits 31C corresponds to the switch circuit 31C' shown in FIG. 15 to which the internal control signal generation circuit 21B supplies a signal RWTESTD in place of the signal RWTEST.

In the fourth embodiment described above, when the levels of signals OEB and WEB are high and the level of signal CEB is low, the device is set in the test mode. In this case, the data input/output terminals I/Oi output timing control signals. If the level of signal CEB is low but that of signal OEB is low, the device is set in the normal read mode. In this case, not the timing control signals but normal cell data is output from the data input/output terminal I/Oi. When the level of signal WEB is low, the device is set in the normal write mode. In this case, data Di is written to the memory cell from the data input/output terminals I/Oi.

According to the fourth embodiment, the normal operating mode and the test modes for monitoring an internal operation can easily be switched by a combination of external control signals. For this reason, the device of the present invention efficiently operates particularly when the internal operation is monitored while comparing two states of the normal operating mode and test modes and while rewriting data.

Fifth Embodiment

Figure 24:
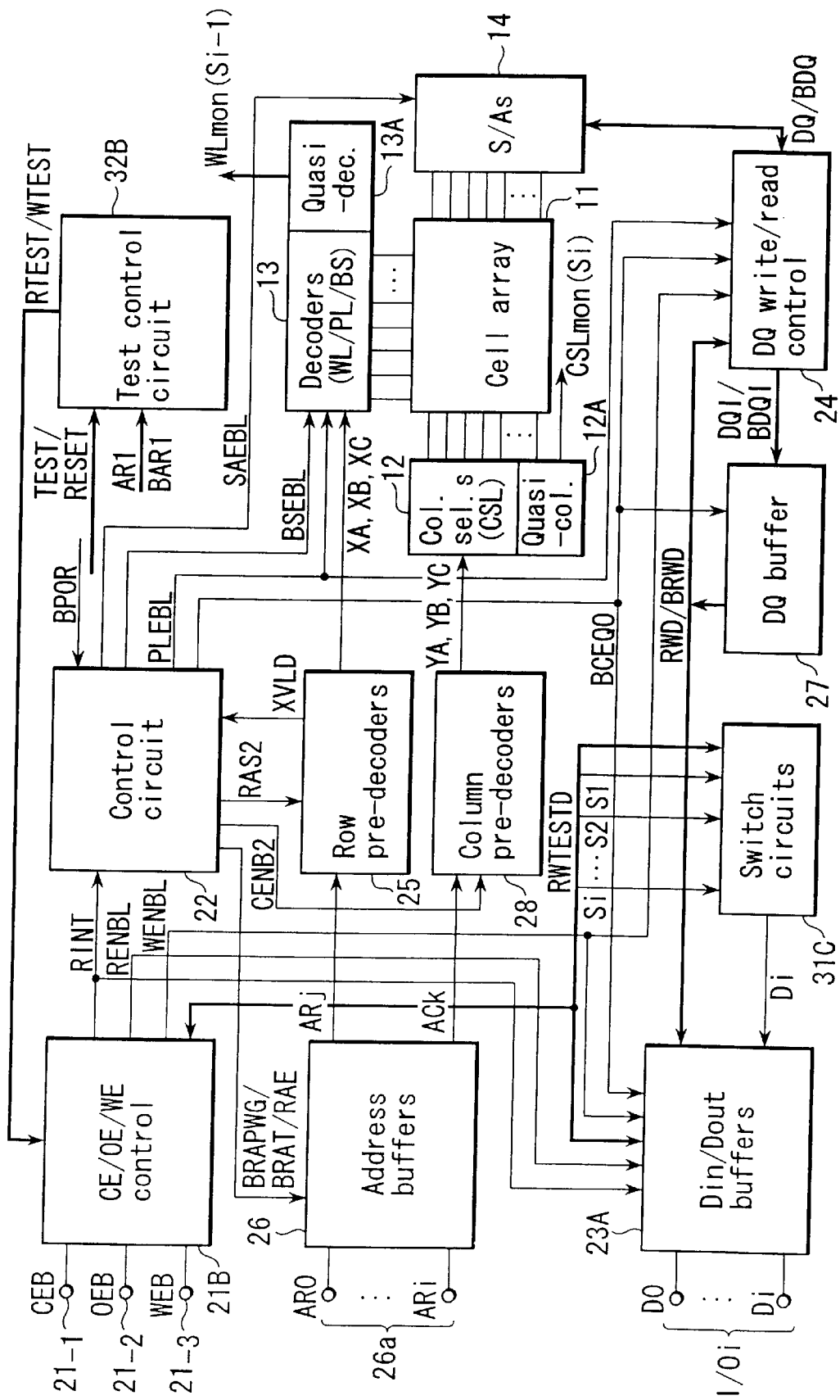
FIG. 24 is a block diagram showing an example of a configuration of a semiconductor memory device (semiconductor memory chip) according to a fifth embodiment of the present invention.

FIG. 24 shows an example of a configuration of a semiconductor memory device (semiconductor memory chip) according to a fifth embodiment of the present invention. In this embodiment, the test modes and normal operating mode can be switched in response to an external control signal (fourth embodiment) and the word line driving signal and column select line driving signal can be monitored (third embodiment). The same components as those of the foregoing third and fourth embodiments are denoted by the same reference numerals and their detailed descriptions are omitted.

The fifth embodiment corresponds to the semiconductor memory chip shown in FIG. 21 to which the quasi-column select circuit 12A (see FIG. 19) and the quasi-row decoder circuit 13A (see FIG. 18) are added.

The configuration of the fifth embodiment allows a semiconductor memory chip having both functions of the third and fourth embodiments to be achieved. More specifically, not only the test modes and normal operating mode can be switched in response to an external control signal but also the quasi-word line driving signal WLmon and quasi-column select line driving signal CSLmon can be monitored.

Sixth Embodiment

Figure 25:
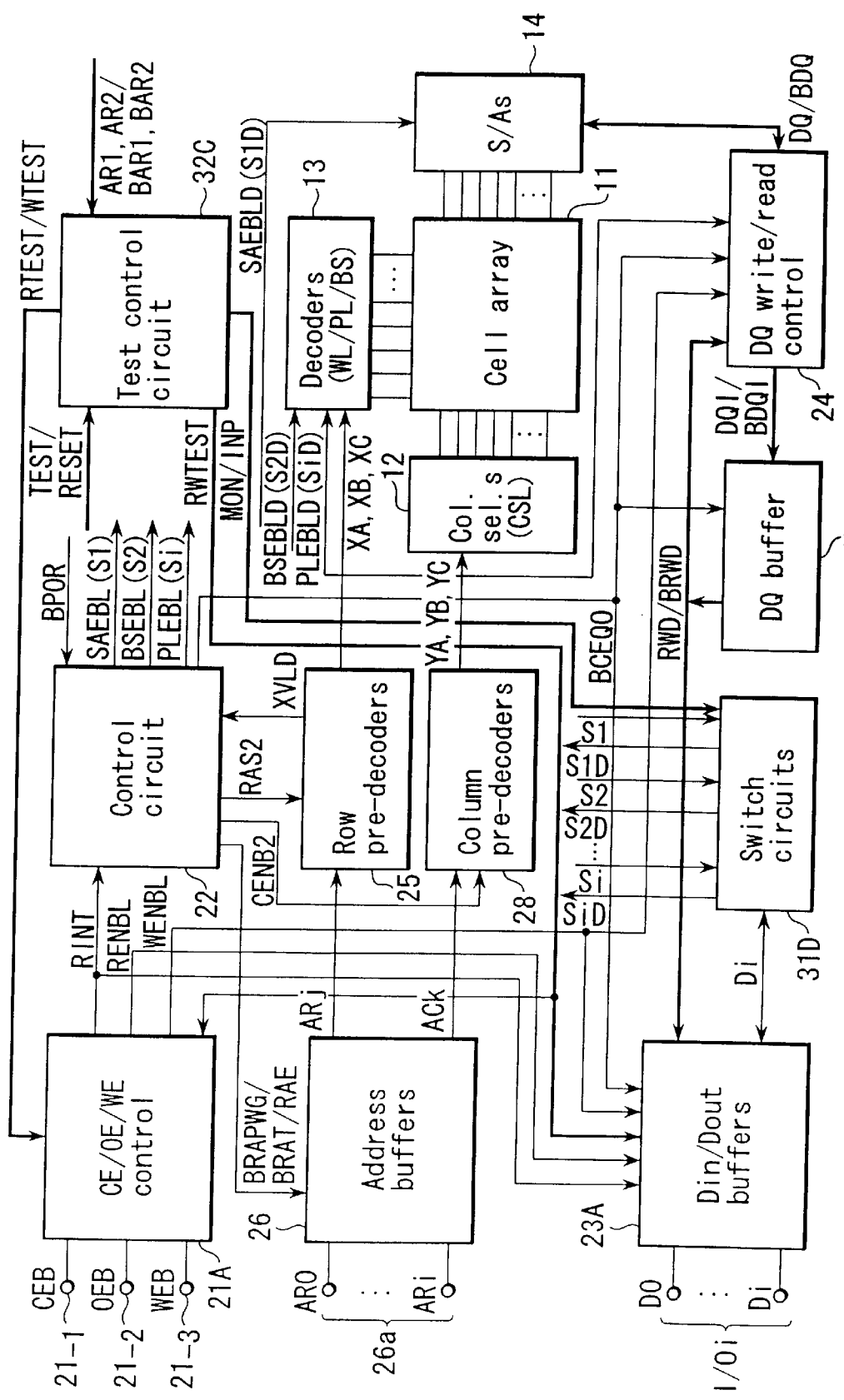
FIG. 25 is a block diagram showing an example of a configuration of a semiconductor memory device (semiconductor memory chip) according to a sixth embodiment of the present invention.

FIG. 25 shows an example of a configuration of a semiconductor memory device (semiconductor memory chip) according to a sixth embodiment of the present invention. The semiconductor memory device has an external control mode for allowing timing control signals to receive from outside as well as a monitor test mode for outputting timing control signals from data input/output terminals I/O. The same components as those of the second embodiment are denoted by the same reference numerals and their detailed descriptions are omitted.

According to the sixth embodiment, as illustrated in FIG. 25, the device is set in the test mode or external control mode in response to signals MON and INP supplied to switch circuits 31D from a test control circuit 32C. When the level of signal MON is high, the device is set in the test mode. When the level of signal INP is high, the device is set in the external control mode. The signals MON and INP are controlled by a combination of signals AR(1), BAR(1), AR(2) and BAR(2) supplied from the address input terminals 26a of address buffer circuits 26.

Figure 26:
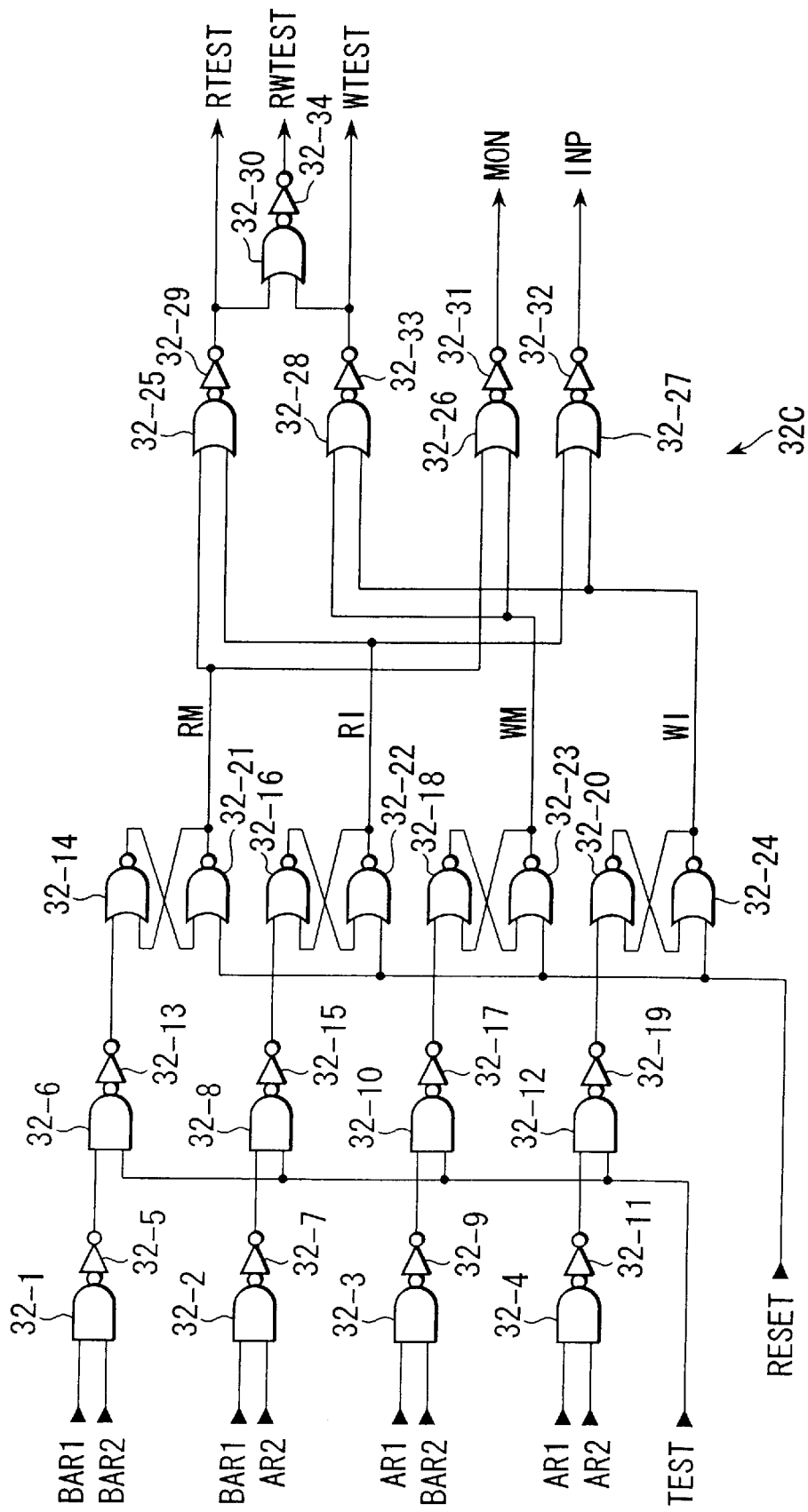
FIG. 26 is a circuit diagram showing an example of arrangement of a test control circuit in the semiconductor memory chip shown in FIG. 25.

FIG. 26 shows an example of arrangement of the test control circuit 32C. The signal BAR(1) is supplied to one input terminal of a NAND circuit $32_{-1}$ and one input terminal of a NAND circuit $32_{-2}$. The signal BAR(2) is supplied to the other input terminal of the NAND circuit $32_{-1}$ and one input terminal of a NAND circuit $32_{-3}$. The signal AR(2) is supplied to the other input terminal of the NAND circuit $32_{-2}$ and one input terminal of a NAND circuit $32_{-4}$. The signal AR(1) is supplied to the other input terminal of the NAND circuit $32_{-3}$ and the other input terminal of the NAND circuit $32_{-4}$. An output of the NAND circuit $32_{-1}$ is supplied to one input terminal of a NAND circuit $32_{-6}$ via an inverter circuit $32_{-5}$. An output of the NAND circuit $32_{-2}$ is supplied to one input terminal of a NAND circuit $32_{-8}$ through an inverter circuit $32_{-7}$. An output of the NAND circuit $32_{-3}$ is supplied to one input terminal of a NAND circuit $32_{-10}$ through an inverter circuit $32_{-9}$. An output of the NAND circuit $32_{-4}$ is supplied to one input terminal of a NAND circuit $32_{-12}$ through an inverter circuit $32_{-11}$. A signal TEST is supplied to the other input terminals of the NAND circuits $32_{-6}$, $32_{-8}$, $32_{-10}$, and $32_{-12}$. An output of the NAND circuit $32_{-6}$ is supplied to one input terminal of a NOR circuit $32_{-14}$ through an inverter circuit $32_{-13}$. An output of the NAND circuit $32_{-8}$ is supplied to one input terminal of a NOR circuit $32_{-16}$ via an inverter circuit $32_{-15}$. An output of the NAND circuit $32_{-10}$ is supplied to one input terminal of a NOR circuit $32_{-18}$ through an inverter circuit $32_{-17}$. An output of the NAND circuit $32_{-12}$ is supplied to one input terminal of a NOR circuit $32_{-20}$ through an inverter circuit $32_{-19}$.

An output of the NOR circuit $32_{-14}$ is supplied to one input terminal of a NOR circuit $32_{-21}$. An output of the NOR circuit $32_{-16}$ is supplied to one input terminal of a NOR circuit $32_{-22}$. An output of the NOR circuit $32_{-18}$ is supplied to one input terminal of a NOR circuit $32_{-23}$. An output of the NOR circuit $32_{-20}$ is supplied to one input terminal of a NOR circuit $32_{-24}$. A signal RESET is supplied to the other input terminals of the NOR circuits $32_{-21}$, $32_{-22}$, $32_{-23}$ and $32_{-24}$. An output (RM) of the NOR circuit $32_{-21}$ is supplied to the other input terminal of the NOR circuit $32_{-14}$ and one input terminal of each of the NOR circuits $32_{-25}$ and $32_{-26}$. An output (RI) of the NOR circuit $32_{-22}$ is supplied to the other input terminal of the NOR circuit $32_{-16}$ and the other input terminals of the NOR circuits $32_{-25}$ and $32_{-27}$. An output (WM) of the NOR circuit $32_{-23}$ is supplied to the other input terminal of the NOR circuit $32_{-18}$ and to the other input terminal of the NOR circuit $32_{-26}$ and one input terminal of the NOR circuit $32_{-28}$. An output (WI) of the NOR circuit $32_{-24}$ is supplied to the other input terminal of the NOR circuit $32_{-20}$ and the other input terminals of the NOR circuits $32_{-27}$ and $32_{-28}$.

An output of the NOR circuit $32_{-25}$ is produced as a signal RTEST through an inverter circuit $32_{-29}$ and supplied to one input terminal of a NOR circuit $32_{-30}$. An output of the NOR circuit $32_{-26}$ is produced as a signal MON through an inverter circuit $32_{-31}$ (mode select circuit). An output of the NOR circuit $32_{-27}$ is produced as a signal INP through an inverter circuit $32_{-32}$ (mode select circuit). An output of the NOR circuit $32_{-28}$ is produced as a signal WTEST through an inverter circuit $32_{-33}$ and supplied to the other input terminal of the NOR circuit $32_{-30}$. An output of the NOR circuit $32_{-30}$ is produced as a signal RWTEST through an inverter circuit $32_{-34}$.

In the test control circuit 32C so arranged, when the levels of signals AR(1) and AR(2) are low (L), the level of signal MON becomes high (H) and so does that of signal RTEST. In this case, the circuit is brought into a read monitor test mode for monitoring timing control signals in the normal read mode. When the level of signal AR(1) is low (L) and that of signal AR(2) is high (H), the level of signal INP becomes high and so does that of signal RTEST. In this case, the circuit is brought into a read and external control mode for allowing timing control signals to receive in the normal read mode. When the level of signal AR(1) is high (H) and that of signal AR(2) is low (L), the level of signal MON becomes high (H) and so does that of signal WTEST. In this case, the circuit is brought into a write monitor test mode for monitoring timing control signals in the normal write mode. When the levels of signals AR(1) and AR(2) are high (H), the level of signal INP becomes high and so does that of signal WTEST. In this case, the circuit is brought into a write and external control mode for allowing timing control signals to receive in the normal write mode.

Figure 27:
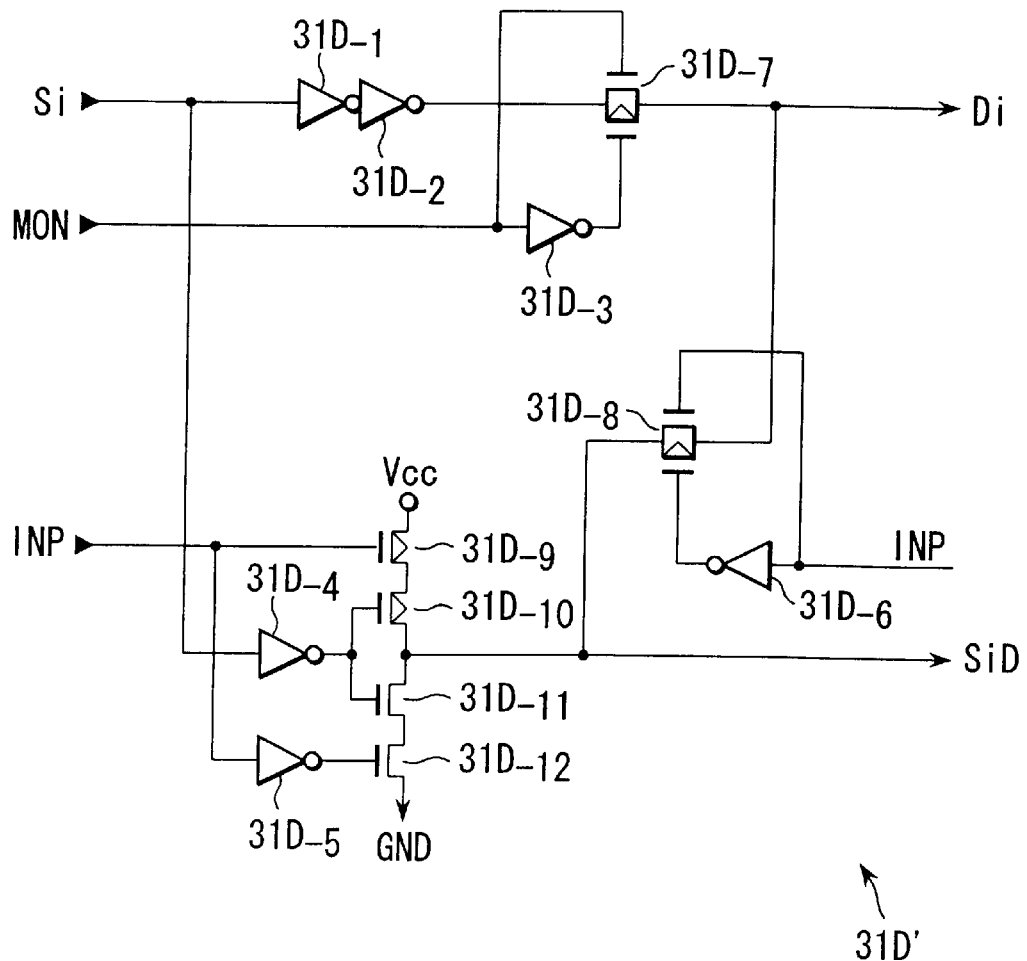
FIG. 27 is a circuit diagram showing an example of arrangement of switch circuits in the semiconductor memory chip shown in FIG. 25.

The switch circuits 31D include a plurality of switch circuits 31D'. FIG. 27 shows an example of one of the switch circuits 31D'. Each of the switch circuits 31D' includes six inverter circuits $31D_{-1}$, $31D_{-2}$, ..., and $31D_{-6}$, two transfer gates $31D_{-7}$ and $31D_{-8}$, two p-channel MOS transistors $31D_{-9}$ and $31D_{-10}$, and two n-channel MOS transistors $31D_{-11}$ and $31D_{-12}$.

When the level of signal INP is high (H), the switch circuit 31D' receives a plurality of timing control signals as data Di from the data input/output terminals I/Oi through the data input/output buffer circuits 23A. Then, the circuit 31D' supplies the data Di to the respective components as data SiD. On the other hand, when the level of signal MON is high, the circuit 31D' receives a plurality of timing control signals as input signals Si. Then, the circuit 31D' converts the input signal Si into data Di and outputs it to the data input/output buffer circuits 23A from the data input/output terminals I/Oi.

Of the timing control signals, for example, signals SAEBL(S1), BSEBL(S2), ..., and PLEBL(Si) are supplied through the switch circuits 31D as signals SAEBLD(S1D), BSEBLD(S2D), ..., and PLEBLD(SiD), respectively.

The timing control signals can thus be supplied from outside. Consequently, the timing of an internal operation, a delay in signal, etc. can be evaluated more easily.

Seventh Embodiment

Figure 28:
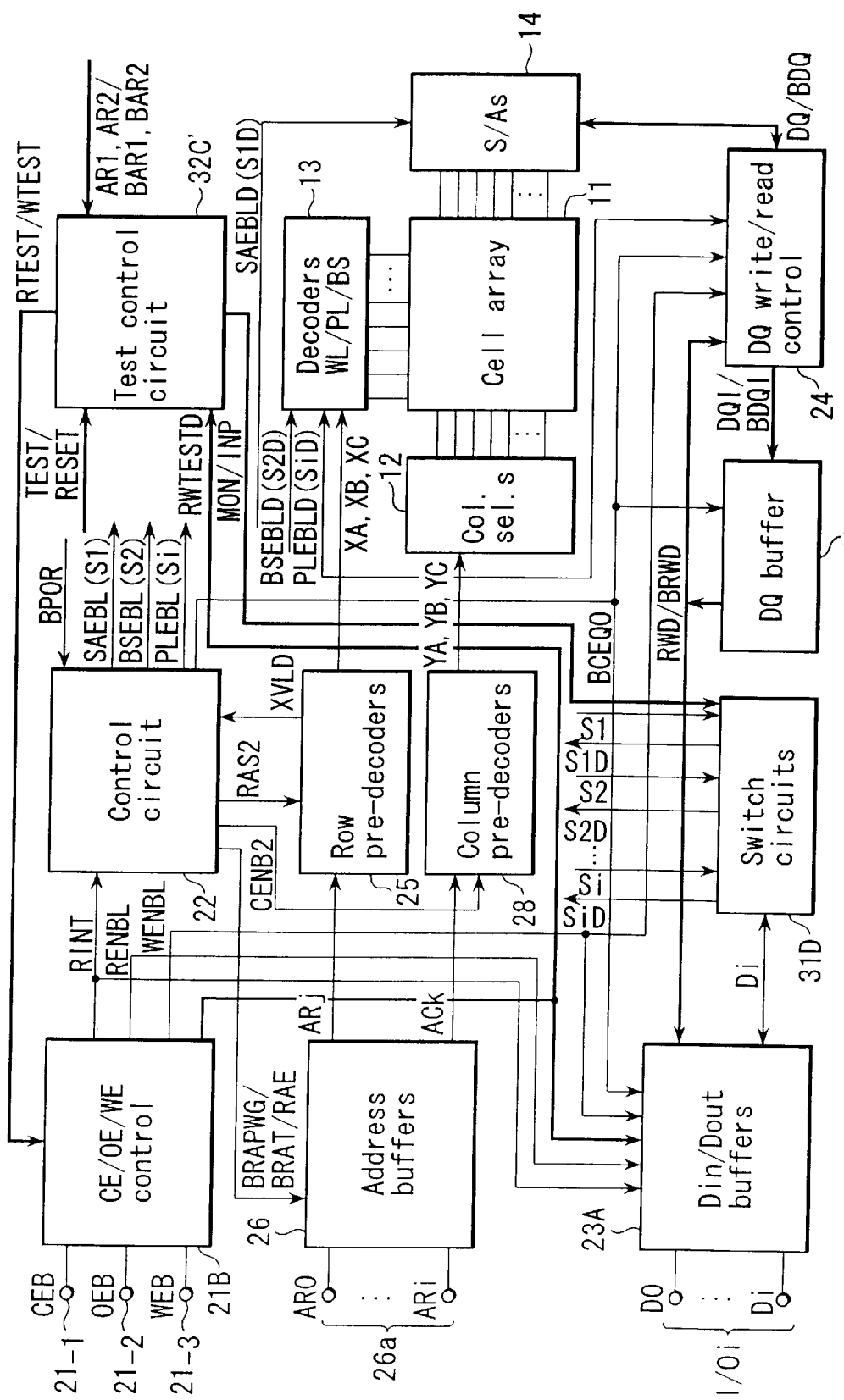
FIG. 28 is a block diagram showing an example of a configuration of a semiconductor memory device (semiconductor memory chip) according to a seventh embodiment of the present invention.

FIG. 28 shows an example of a configuration of a semiconductor memory device (semiconductor memory chip) according to a seventh embodiment of the present invention. In the seventh embodiment, an external control mode for allowing timing control signals to receive from outside can be set (sixth embodiment) and a test mode and a normal operating mode can be switched to each other in response to external control signals (fourth embodiment). The same components as those of the fourth and sixth embodiments are denoted by the same reference numerals and their detailed descriptions are omitted.

The seventh embodiment corresponds to the semiconductor memory chip shown in FIG. 25 in which the internal control signal generation circuit 21B (see FIG. 22) supplies an output test signal RWTESTD to the data input/output buffer circuits 23A and test control circuit 32C'.

Figure 29:
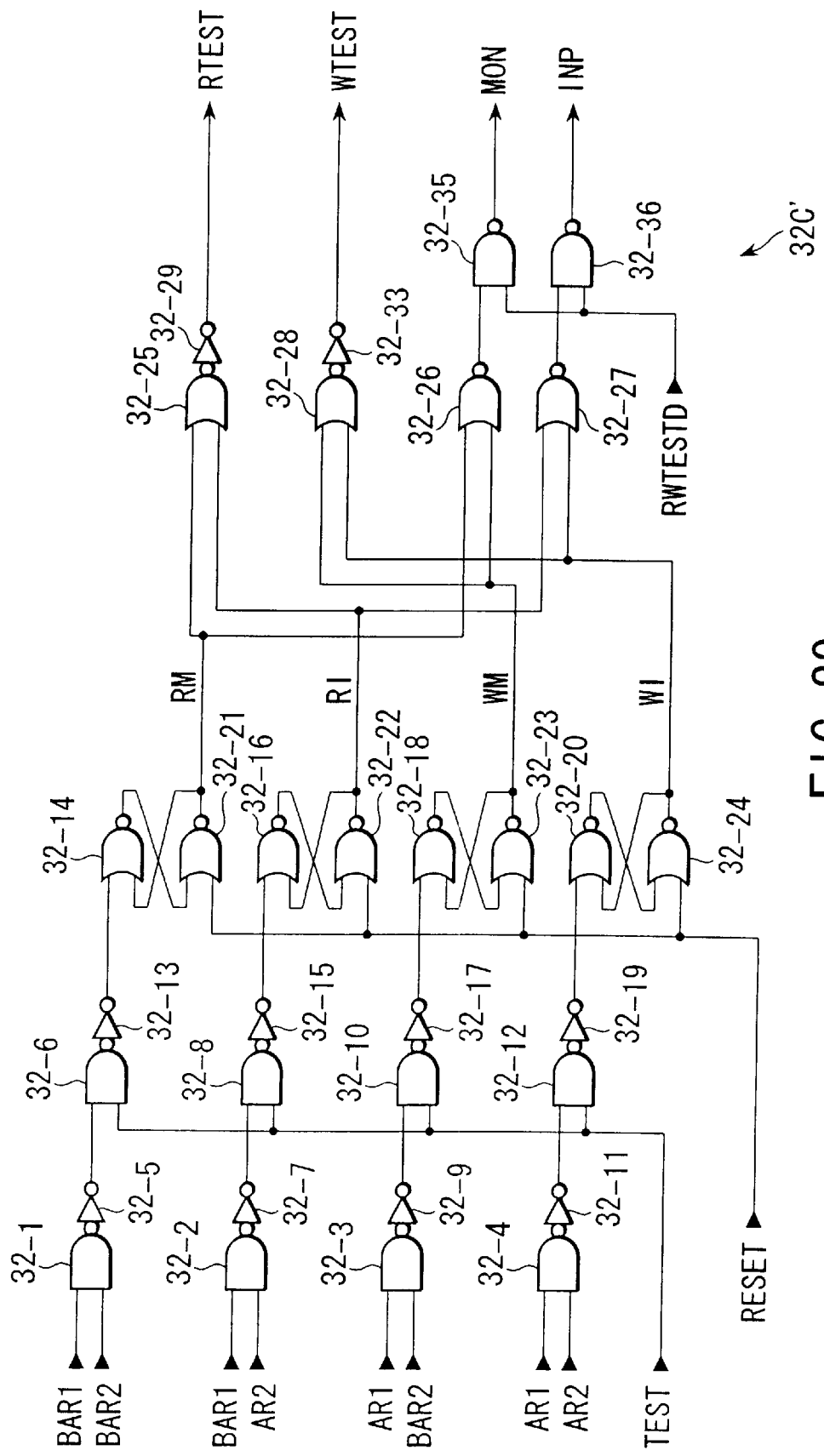
FIG. 29 is a circuit diagram showing an example of arrangement of a test control circuit in the semiconductor memory chip shown in FIG. 28.

FIG. 29 shows an example of arrangement of the test control circuit 32C'. In this circuit, an output of a NOR circuit $32_{-26}$ is supplied to one input terminal of a NAND circuit $32_{-35}$. An output of a NOR circuit $32_{-27}$ is supplied to one input terminal of a NAND circuit $32_{-36}$. An output test signal RWTESTD is supplied to the other input terminals of the NAND circuits $32_{-35}$ and $32_{-36}$ from the internal control signal generation circuit 21B. Then, an output of the NAND circuit $32_{-35}$ is produced as a signal MON and that of the NAND circuit $32_{-36}$ is produced as a signal INP. However, the test control circuit 32C' includes neither a NOR circuit $32_{-30}$ for generating a signal RWTEST nor an inverter circuit $32_{-34}$.

With the above circuit arrangement, a semiconductor memory chip having both the function according to the fourth embodiment and the function (external control mode) according to the sixth embodiment can be achieved. More specifically, not only the test mode and normal operating mode can be switched to each other in response to external control signals, but also timing control signals can be supplied from outside in a mode different from the test mode for outputting the timing control signals from the data input/output terminals I/Oi.

In the respective embodiments described above, upon receiving a test signal TEST, which is a pulse signal from a test entry circuit, the semiconductor memory chip is set in the test mode. As another method, for example, a high-voltage signal or a command can be input to set the chip in the test mode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array;
    a plurality of input/output terminals to input cell data written to the memory cell array and output cell data read from the memory cell array;
    a test mode setting circuit which sets a test mode to monitor a plurality of timing signals which control input/output operation timing of the cell data; and
    switch circuits which simultaneously output the plurality of timing signals from the plurality of input/output terminals in the test mode.

2. The semiconductor memory device according to claim 1, further comprising a state control circuit which controls the device so as to operate in a normal operating mode when the test mode is set by the test mode setting circuit.

3. The semiconductor memory device according to claim 2, wherein the state control circuit sets the device in a normal read mode to read cell data in response to an input level of an external signal.

4. The semiconductor memory device according to claim 2, wherein the state control circuit sets the device in a normal write mode to write cell data in response to an input level of an external signal.

5. The semiconductor memory device according to claim 2, wherein the state control circuit is part of the test mode setting circuit.

6. The semiconductor memory device according to claim 2, further comprising an internal control signal generation circuit which controls an internal operation in the normal operating mode in response to input timing of an external control signal.

7. The semiconductor memory device according to claim 6, wherein the internal control signal generation circuit switches the test mode and the normal operating mode to each other in response to an input level of an external control signal.

8. The semiconductor memory device according to claim 1, wherein the switch circuits include a plurality of switch circuits and each of the switch circuits has a first tristate circuit which is operated by an external power supply voltage.

9. The semiconductor memory device according to claim 1, wherein the switch circuits include a plurality of switch circuits, and each of the switch circuits has a second tristate circuit which is operated by a dedicated power supply voltage other than an external power supply voltage and a voltage switching circuit which switches between the external power supply voltage and the dedicated power supply voltage.

10. The semiconductor memory device according to claim 9, wherein the second tristate circuit and the voltage switching circuit each include a protection transistor, and a positive potential is applied to gates of the protection transistor.

11. The semiconductor memory device according to claim 1, further comprising a plurality of buffer circuits connected to the plurality of input/output terminals, respectively.

12. The semiconductor memory device according to claim 11, wherein the plurality of buffer circuits include a first buffer circuit to output cell data from one of the plurality of input/output terminals in the test mode and a plurality of second buffer circuits to output a plurality of timing signals from other input/output terminals in the test mode.

13. The semiconductor memory device according to claim 12, wherein the second buffer circuits each include a path switching circuit and output the plurality of timing signals from the plurality of input/output terminals in the test mode.

14. The semiconductor memory device according to claim 13, wherein the path switching circuit is controlled by an output of the test mode setting circuit.

15. The semiconductor memory device according to claim 11, wherein the plurality of buffer circuits output the plurality of timing signals from the plurality of input/output terminals in the test mode.

16. The semiconductor memory device according to claim 1, which further comprises a quasi-row decoder circuit which is equivalent to a row decoder to drive word lines formed in the memory cell array, and in which the switch circuits output quasi-word line driving signals generated from the quasi-row decoder circuit from one of the plurality of input/output terminals.

17. The semiconductor memory device according to claim 1, which further comprises a quasi-column select circuit which is equivalent to a column select circuit to drive column select lines formed in the memory cell array, and in which the switch circuits output quasi-column select signals generated from the quasi-column select circuit from one of the plurality of input/output terminals.

18. The semiconductor memory device according to claim 1, further comprising a mode select circuit which controls the switch circuits in accordance with a combination of external signals and selects one of the test mode and an external control mode to input a desired timing signal from the plurality of input/output terminals.

* * * * *